United States Patent
Chainer et al.

(10) Patent No.: US 9,043,035 B2
(45) Date of Patent: May 26, 2015

(54) DYNAMICALLY LIMITING ENERGY CONSUMED BY COOLING APPARATUS

(75) Inventors: Timothy J. Chainer, Putnam Valley, NY (US); Milnes P. David, Fishkill, NY (US); Madhusudan K. Iyengar, Woodstock, NY (US); Pritish R. Parida, Fishkill, NY (US); Roger R. Schmidt, Poughkeepsie, NY (US); Mark D. Schultz, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 575 days.

(21) Appl. No.: 13/305,967

(22) Filed: Nov. 29, 2011

(65) Prior Publication Data

US 2013/0138252 A1    May 30, 2013

(51) Int. Cl.
*G06F 19/00*    (2011.01)
*G05D 7/06*     (2006.01)
(Continued)

(52) U.S. Cl.
CPC .............. *G05D 7/0635* (2013.01); *G06F 1/206* (2013.01); *G11B 33/144* (2013.01); *H05K 7/20281* (2013.01); *H05K 7/20836* (2013.01);
(Continued)

(58) Field of Classification Search
CPC .......... G05D 7/0635; G06F 1/20; G06F 1/206
USPC .................... 700/282; 361/696, 699; 62/259.2
See application file for complete search history.

(56) References Cited

U.S. PATENT DOCUMENTS

| 3,807,493 A | 4/1974 | Stewart |
| 5,168,921 A | 12/1992 | Meyer |

(Continued)

FOREIGN PATENT DOCUMENTS

| CN | 201222836 Y | 4/2009 |
| EP | 2 357 878 A2 | 1/2011 |

(Continued)

OTHER PUBLICATIONS

A Process Control Primer, Dan O'Connor, Honeywell, Sensing and Control. Revision 1, Jul. 2000.*

(Continued)

*Primary Examiner* — Michael D Masinick
(74) *Attorney, Agent, or Firm* — Margaret A. McNamara, Esq.; Kevin P. Radigan, Esq.; Heslin Rothenberg Farley & Mesiti P.C.

(57) ABSTRACT

Cooling apparatuses and methods are provided which include one or more coolant-cooled structures associated with an electronics rack, a coolant loop coupled in fluid communication with one or more passages of the coolant-cooled structure(s), one or more heat exchange units coupled to facilitate heat transfer from coolant within the coolant loop, and N controllable components associated with the coolant loop or the heat exchange unit(s), wherein N≥1. The N controllable components facilitate circulation of coolant through the coolant loop or transfer of heat from the coolant via the heat exchange unit(s). A controller is coupled to the N controllable components, and dynamically adjusts operation of the N controllable components, based on Z input parameters and one or more specified constraints, to provide a specified cooling to the coolant-cooled structure(s), while limiting energy consumed by the N controllable components, wherein Z≥1.

18 Claims, 21 Drawing Sheets

(51) Int. Cl.
 *G06F 1/20* (2006.01)
 *G11B 33/14* (2006.01)
 *H05K 7/20* (2006.01)
 *G06F 1/32* (2006.01)

(52) U.S. Cl.
 CPC .......... *H05K 7/20781* (2013.01); *H05K 7/2079* (2013.01); *G06F 1/3206* (2013.01); *Y02B 60/1275* (2013.01)

(56) References Cited

U.S. PATENT DOCUMENTS

| | | | |
|---|---|---|---|
| 5,414,591 A | | 5/1995 | Kimura et al. |
| 5,794,454 A | | 8/1998 | Harris et al. |
| 6,011,371 A | | 1/2000 | Van Brocklin et al. |
| 6,263,959 B1 | | 7/2001 | Ikeda et al. |
| 6,305,180 B1 * | | 10/2001 | Miller et al. ................ 62/259.2 |
| 6,400,045 B1 | | 6/2002 | Hosokawa et al. |
| 6,411,512 B1 | | 6/2002 | Mankaruse et al. |
| 6,434,000 B1 | | 8/2002 | Pandolfi et al. |
| 6,462,949 B1 | | 10/2002 | Parish et al. |
| 6,480,014 B1 | | 11/2002 | Li et al. |
| 6,548,894 B2 | | 4/2003 | Chu et al. |
| 6,557,354 B1 | | 5/2003 | Chu et al. |
| 6,775,137 B2 | | 8/2004 | Chu et al. |
| 6,924,981 B2 | | 8/2005 | Chu et al. |
| 6,934,118 B2 | | 8/2005 | Hidaka et al. |
| 7,002,799 B2 | | 2/2006 | Malone et al. |
| 7,042,726 B2 | | 5/2006 | Cader et al. |
| 7,151,668 B1 | | 12/2006 | Stathakis |
| 7,165,412 B1 * | | 1/2007 | Bean, Jr. ................ 62/259.2 |
| 7,233,501 B1 | | 6/2007 | Ingalz |
| 7,273,090 B2 | | 9/2007 | Crocker et al. |
| 7,286,355 B2 | | 10/2007 | Cheon |
| 7,310,737 B2 | | 12/2007 | Patel et al. |
| 7,365,985 B1 | | 4/2008 | Ni |
| 7,385,810 B2 | | 6/2008 | Chu et al. |
| 7,388,749 B1 | | 6/2008 | Feroli et al. |
| 7,395,851 B2 | | 7/2008 | Lee et al. |
| 7,420,804 B2 | | 9/2008 | Leija et al. |
| 7,436,663 B2 | | 10/2008 | Matsushima et al. |
| 7,440,278 B2 | | 10/2008 | Cheng |
| 7,443,672 B2 | | 10/2008 | Peng et al. |
| 7,450,385 B1 | | 11/2008 | Campbell et al. |
| 7,469,551 B2 | | 12/2008 | Tilton et al. |
| 7,522,418 B2 | | 4/2009 | Ishimine |
| 7,551,440 B2 | | 6/2009 | Belady et al. |
| 7,573,714 B2 | | 8/2009 | Ali |
| 7,583,043 B2 | | 9/2009 | Chung et al. |
| 7,595,550 B2 | | 9/2009 | Cady et al. |
| 7,626,820 B1 | | 12/2009 | Konshak et al. |
| 7,660,109 B2 | | 2/2010 | Iyengar et al. |
| 7,684,196 B2 | | 3/2010 | Eckberg et al. |
| 7,701,714 B2 | | 4/2010 | Shabany |
| 7,703,291 B2 | | 4/2010 | Bushnik et al. |
| 7,746,634 B2 | | 6/2010 | Hom et al. |
| 7,791,882 B2 * | | 9/2010 | Chu et al. ................ 361/698 |
| 7,796,393 B2 | | 9/2010 | Legen et al. |
| 7,796,399 B2 | | 9/2010 | Clayton et al. |
| 7,817,412 B2 | | 10/2010 | Sullivan |
| 7,826,216 B2 | | 11/2010 | Moss |
| 7,830,657 B2 | | 11/2010 | Chu et al. |
| 7,855,890 B2 | | 12/2010 | Kashirajima et al. |
| 2,907,406 A1 | | 3/2011 | Campbell et al. |
| 7,950,244 B2 * | | 5/2011 | Iyengar et al. ................ 62/259.2 |
| 7,990,709 B2 * | | 8/2011 | Campbell et al. ................ 361/696 |
| 8,018,718 B2 | | 9/2011 | Goth et al. |
| 8,027,162 B2 | | 9/2011 | Campbell et al. |
| 8,035,972 B2 | | 10/2011 | Ostwald et al. |
| 8,170,724 B2 * | | 5/2012 | Kelley et al. ................ 700/299 |
| 8,208,258 B2 | | 6/2012 | Campbell et al. |
| 8,351,206 B2 | | 1/2013 | Campbell et al. |
| 8,437,129 B2 | | 5/2013 | Tung et al. |
| 8,760,855 B2 | | 6/2014 | Howes et al. |
| 8,867,205 B2 | | 10/2014 | Eagle |
| 2001/0000880 A1 | | 5/2001 | Chu et al. |
| 2005/0068728 A1 | | 3/2005 | Chu et al. |
| 2006/0146497 A1 | | 7/2006 | Gauche et al. |
| 2006/0250770 A1 | | 11/2006 | Campbell et al. |
| 2006/0250772 A1 | | 11/2006 | Salmonson et al. |
| 2007/0034356 A1 | | 2/2007 | Kenny et al. |
| 2007/0187069 A1 | | 8/2007 | Ueno et al. |
| 2007/0263356 A1 | | 11/2007 | Weber et al. |
| 2007/0291452 A1 | | 12/2007 | Gilliland et al. |
| 2008/0112075 A1 | | 5/2008 | Farquhar et al. |
| 2008/0155990 A1 | | 7/2008 | Gupta et al. |
| 2008/0239564 A1 | | 10/2008 | Farquhar et al. |
| 2008/0259566 A1 | | 10/2008 | Fried |
| 2008/0259567 A1 | | 10/2008 | Campbell et al. |
| 2008/0310105 A1 | | 12/2008 | Cheng |
| 2008/0313492 A1 | | 12/2008 | Hansen |
| 2009/0002951 A1 | | 1/2009 | Legen et al. |
| 2009/0080151 A1 | | 3/2009 | Kalms et al. |
| 2009/0086432 A1 * | | 4/2009 | Campbell et al. ............. 361/696 |
| 2009/0120607 A1 | | 5/2009 | Cheon et al. |
| 2009/0122488 A1 * | | 5/2009 | Iyengar et al. ............... 361/700 |
| 2009/0126909 A1 * | | 5/2009 | Ellsworth et al. ........ 165/104.33 |
| 2009/0133866 A1 * | | 5/2009 | Campbell et al. ............. 165/288 |
| 2009/0177334 A1 | | 7/2009 | Artman et al. |
| 2009/0201640 A1 | | 8/2009 | Bard et al. |
| 2009/0201644 A1 * | | 8/2009 | Kelley et al. .................. 361/699 |
| 2009/0207564 A1 * | | 8/2009 | Campbell et al. ............. 361/688 |
| 2009/0207567 A1 | | 8/2009 | Campbell et al. |
| 2009/0219687 A1 | | 9/2009 | Lin |
| 2009/0268404 A1 * | | 10/2009 | Chu et al. ..................... 361/696 |
| 2009/0277616 A1 | | 11/2009 | Cipolla et al. |
| 2009/0284924 A1 | | 11/2009 | Konshak et al. |
| 2010/0025010 A1 | | 2/2010 | Cipolla et al. |
| 2010/0027220 A1 | | 2/2010 | Hughes et al. |
| 2010/0085712 A1 | | 4/2010 | Hrehor et al. |
| 2010/0126696 A1 | | 5/2010 | Novotny et al. |
| 2010/0142147 A1 | | 6/2010 | Chang et al. |
| 2010/0149754 A1 * | | 6/2010 | Chapel et al. ................. 361/696 |
| 2010/0252234 A1 | | 10/2010 | Cambell et al. |
| 2010/0263855 A1 | | 10/2010 | Arimilli et al. |
| 2010/0313590 A1 | | 12/2010 | Campbell et al. |
| 2011/0051372 A1 | | 3/2011 | Barringer et al. |
| 2011/0056674 A1 | | 3/2011 | Campbell et al. |
| 2011/0060470 A1 | | 3/2011 | Campbell et al. |
| 2011/0069454 A1 | | 3/2011 | Campbell et al. |
| 2011/0197612 A1 * | | 8/2011 | Campbell et al. ............. 62/259.2 |
| 2011/0205705 A1 | | 8/2011 | Graybill et al. |
| 2011/0232889 A1 | | 9/2011 | Eckberg et al. |
| 2011/0313576 A1 | | 12/2011 | Nicewonger |
| 2011/0315353 A1 | | 12/2011 | Campbell et al. |
| 2012/0279233 A1 | | 11/2012 | Chainer et al. |
| 2012/0281359 A1 | | 11/2012 | Arney et al. |
| 2013/0107453 A1 | | 5/2013 | Chainer et al. |
| 2013/0138253 A1 | | 5/2013 | Chainer et al. |
| 2013/0174421 A1 | | 7/2013 | Chainer et al. |
| 2014/0069111 A1 | | 3/2014 | Campbell et al. |
| 2014/0123493 A1 * | | 5/2014 | Campbell et al. .......... 29/890.03 |

FOREIGN PATENT DOCUMENTS

| | | | |
|---|---|---|---|
| JP | | 01077199 A | 3/1989 |
| JP | | 2010040886 A | 2/2010 |
| TW | | 323643 U | 12/2007 |
| TW | | 200937175 A | 9/2009 |
| WO | | WO 2011/025487 A1 | 3/2011 |

OTHER PUBLICATIONS

Notification of Transmittal of the International Search Report and the Written Opinion, issued for PCT Application No. PCT/EP2012/068516, dated Mar. 26, 2013 (10 pages).

Chainer et al., Office Action for U.S. Appl. No. 13/102,195, filed May 6, 2011 (U.S. Patent Publication No. 2012/0279233 A1), dated Jul. 17, 2013 (38 pgs.).

Chainer et al., Notice of Allowance for U.S. Appl. No. 13/283,933, filed Oct. 28, 2011 (U.S. Patent Publication No. 2013/0107453 A1), dated Aug. 26, 2013 (23 pgs.).

(56) References Cited

OTHER PUBLICATIONS

Search Report issued by the Great Britain Intellectual Property Office (IPO) for GB Application Na 1216684.9, dated Jan. 14, 2013.

IBM Technical Disclosure, "Highly-Efficient Copper Rail Design for Optimized Cooling of DRAM Modules", IPCOM000184053D (Jun. 9, 2009).

Chainer et al., "Thermoelectric-Enhanced, Liquid-Based Cooling of a Multi-Component Electronic System", U.S. Appl. No. 13/102,195, filed May 6, 2011.

Chainer et al., "Directly Connected Heat Exchanger Tube Section and Coolant-Cooled Structure", U.S. Appl. No. 13/283,933, filed Oct. 28, 2011.

Chainer et al., Office Action for U.S. Appl. No. 13/705,300, filed Dec. 5, 2012 (U.S. Patent Publication No. 2013/0138253 A1), dated Apr. 22, 2014 (9 pages).

Chainer et al., Office Action for U.S. Appl. No. 13/711,854, filed Dec. 12, 2012 (U.S. Patent Publication No. 2013/0174421 A1), dated Nov. 17, 2014 (11 pages).

Chainer et al., Office Action for U.S. Appl. No. 13/102,200, filed May 6, 2011 (U.S. Patent Publication No. 2012/0279686 A1), dated Mar. 19, 2015 (23 pages).

* cited by examiner

| ROW # | INPUT 1 | INPUT 2 | ... | INPUT Z | FAN F1 RPM | FAN F2 RPM | ... | FAN FN RPM | PUMP P1 RPM | PUMP P2 RPM | ... | PUMP P2N RPM | RECIRC VALVE V1 | RECIRC VALVE V2 | ... | RECIRC VALVE VN |
|---|---|---|---|---|---|---|---|---|---|---|---|---|---|---|---|---|
| 1 | I1,1 | I2,1 | ... | IZ,1 | F1,1 | F2,1 | ... | FN,1 | P1,1 | P2,1 | ... | P2N,1 | V1,1 | V2,1 | ... | VN,1 |
| 2 | I1,2 | I2,2 | ... | IZ,2 | F1,2 | F2,2 | ... | FN,2 | P1,2 | P2,2 | ... | P2N,2 | V1,2 | V2,2 | ... | VN,2 |
| ... | ... | ... | ... | ... | ... | ... | ... | ... | ... | ... | ... | ... | ... | ... | ... | ... |
| r1 | I1,r1 | ... | | | | | | | | | | | | | | |
| r2 | I1,r2 | I2,r3 | | | | | | | | | | | | | | |
| r3 | ... | I2,r3 | | | | | | | | | | | | | | |
| r4 | ... | I2,r4 | | | | | | | | | | | | | | |
| ... | ... | ... | ... | ... | ... | ... | ... | ... | ... | ... | ... | ... | ... | ... | ... | ... |
| r | I1,r | I2,r | ... | IZ,r | F1,r | F2,r | ... | FN,r | P1,r | P2,r | ... | P2N,r | V1,r | V2,r | ... | VN,r |

- BASED ON THE Z INPUTS/CONSTRAINTS, CRITICAL INPUT CAN BE IDENTIFIED BASED ON THE HIGHEST ROW NUMBER.
- BASED ON THE VALUE OF THE CRITICAL CONSTRAINT, THE VALUE OF THE FANS AND PUMPS RPM AND RECIRCULATION VALVES POSITION CAN BE SELECTED.
- THE CHANGE IN RPMs AND THE VALVE POSITIONS (% OPEN) COULD BE RELATED OR UN-RELATED.

FIG. 8B

DYNAMICALLY LIMITING ENERGY CONSUMED BY COOLING APPARATUS

STATEMENT REGARDING FEDERALLY SPONSORED RESEARCH

This invention was made with Government support under Contract No. DE-EE0002894, awarded by the Department of Energy. Accordingly, the U.S. Government has certain rights in the invention.

BACKGROUND

As is known, operating electronic devices produce heat. This heat should be removed from the devices in order to maintain device junction temperatures within desirable limits, with failure to remove heat effectively resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/$cm^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

BRIEF SUMMARY

In one aspect, the shortcomings of the prior art are overcome and additional advantages are provided through the provision of a cooling apparatus which includes: at least one coolant-cooled structure; a coolant loop; at least one heat exchange unit; N controllable components; and a controller. The at least one coolant-cooled structure is associated with an electronics rack for facilitating dissipation of heat from the electronics rack, and includes at least one coolant-carrying passage. The coolant loop is coupled in fluid communication with the at least one coolant-carrying passage of the at least one coolant-cooled structure. The at least one heat exchange unit is coupled to facilitate heat transfer from coolant within the coolant loop. The N controllable components, wherein $N \geq 1$, are associated with at least one of the coolant loop or the at least one heat exchange unit, and facilitate at least one of circulating of coolant through the coolant loop or transfer of heat from the coolant via the at least one heat exchange unit. The controller is coupled to the N controllable components, and dynamically adjusts operation of the N controllable components, based on Z input parameters and one or more specified constraints, to provide a specified cooling to the at least one coolant-cooled structure while limiting energy consumed by the N controllable components, wherein $Z \geq 1$.

In another aspect, a cooled electronic system is provided which includes an electronics rack, and a cooling apparatus facilitating dissipation of heat from the electronics rack. The cooling apparatus includes: at least one coolant-cooled structure; a coolant loop; at least one heat exchange unit; N controllable components; and a controller. The at least one coolant-cooled structure is associated with the electronics rack for facilitating dissipation of heat from the electronics rack, and includes at least one coolant-carrying passage. The coolant loop is coupled in fluid communication with the at least one coolant-carrying passage of the at least one coolant-cooled structure. The at least one heat exchange unit is coupled to facilitate heat transfer from coolant within the coolant loop. The N controllable components, wherein $N \geq 1$, are associated with at least one of the coolant loop or the at least one heat exchange unit, and facilitate at least one of circulating of coolant through the coolant loop or transfer of heat from the coolant via the at least one heat exchange unit. The controller is coupled to the N controllable components, and dynamically adjusts operation of the N controllable components, based on Z input parameters and one or more specified constraints, to provide a specified cooling to the at least one coolant-cooled structure while limiting energy consumed by the N controllable components, wherein $Z \geq 1$.

In a further aspect, a method of facilitating dissipation of heat from an electronics rack is provided. The method includes: associating at least one coolant-cooled structure with the electronics rack for facilitating dissipation of heat from the electronics rack, the at least one coolant-cooled structure comprising at least one coolant-carrying passage; providing a coolant loop coupled in fluid communication with the at least one coolant-carrying passage of the at least one coolant-cooled structure; associating at least one heat exchange unit with the coolant loop to facilitate heat transfer from coolant within the coolant loop; providing N controllable components associated with at least one of the coolant loop or the at least one heat exchange unit, the N controllable components facilitating at least one of circulating of coolant through the coolant loop or transfer of heat from the coolant via the at least one heat exchange unit, wherein $N \geq 1$; and providing a controller coupled to the N controllable components, the controller dynamically adjusting operation of the N controllable components, based on Z input parameters and one or more specified constraints, to provide a specified cooling to the at least one coolant-cooled structure, while limiting energy consumed by the N controllable components, wherein $Z \geq 1$.

In another aspect, a cooling method is provided which includes: obtaining an electronics rack with an associated cooling apparatus comprising at least one coolant-cooled structure associated with the electronics rack for facilitating dissipation of heat from the electronics rack, the at least one coolant-cooled structure comprising at least one coolant-carrying passage, wherein the cooling apparatus further comprises a coolant loop coupled in fluid communication with the at least one coolant-carrying passage of the at least one coolant-cooled structure, at least one heat exchange unit coupled to facilitate heat transfer from the coolant within the coolant loop, and N controllable components associated with at least one of the coolant loop or the at least one heat exchange unit, the N controllable components facilitating at least one of circulating of coolant through the coolant loop or transfer of heat from the coolant via the at least one heat exchange unit, wherein $N \geq 1$; and dynamically adjusting operation of the N controllable components, based on Z input parameters and one or more specified constraints, to provide a specified cooling to the at least one coolant-cooled structure, while limiting energy consumed by the N controllable components, wherein $Z \geq 1$.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 8B depicts one embodiment of a prespecified data structure referenced by the control process of FIG. 8A, in accordance with one or more aspects of the present invention;

DETAILED DESCRIPTION

Figure 1:
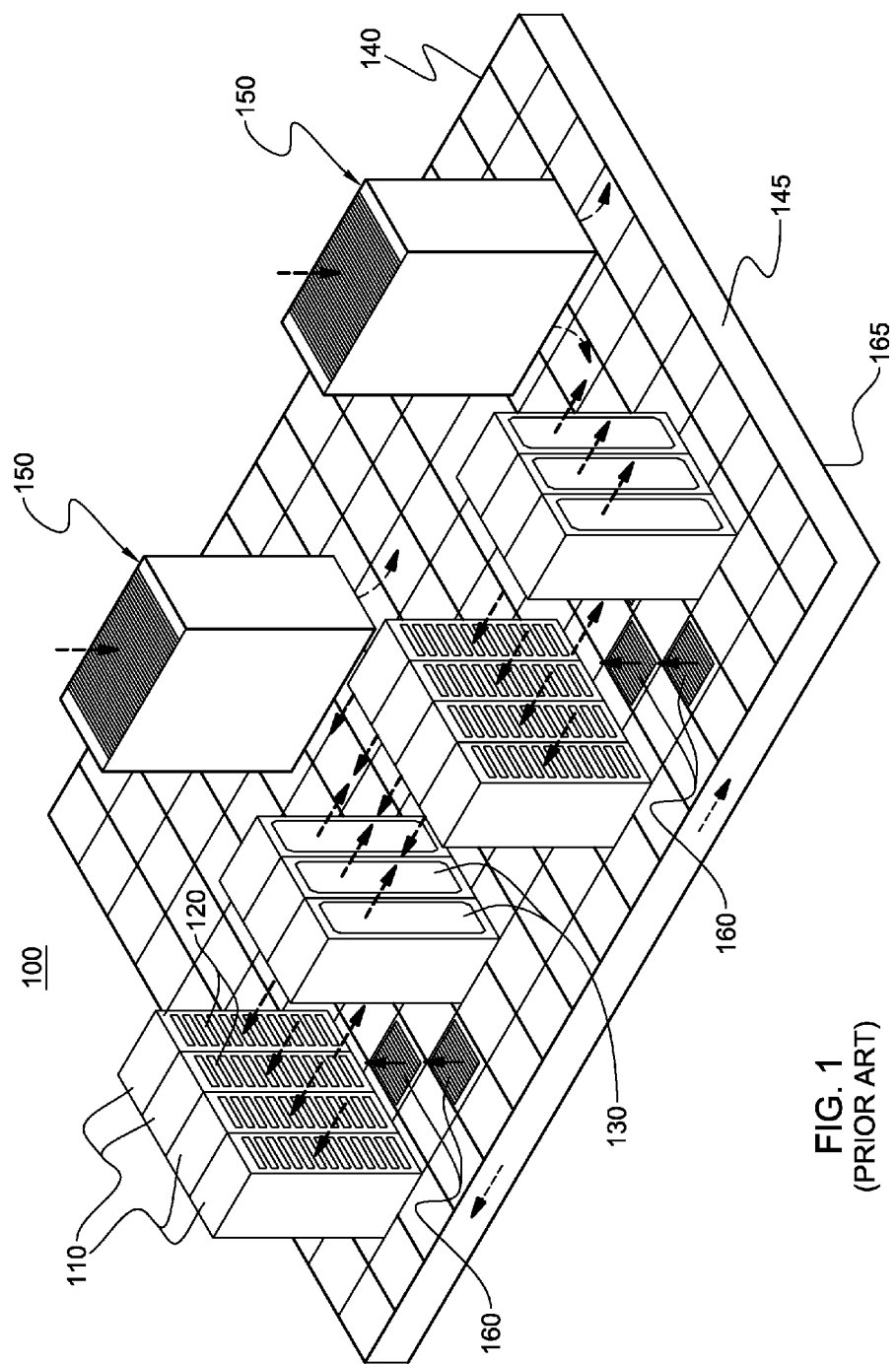
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade center system being two examples of electronic systems (or subsystems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards comprising a plurality of memory modules (such as one or more dual in-line memory modules (DIMMs)), or one or more data storage devices (e.g., replaceable hard drives). As used herein "primary heat-generating component" refers to a primary heat-generating electronic component (such as an integrated circuit die) within an electronic system, while "secondary heat-generating component" refers to an electronic component (such as a replaceable disk drive) generating less heat than the primary heat-generating electronic component. By way of example, the primary heat-generating electronic component may generate, in one embodiment, two times or more heat than the secondary heat-generating component.

Further, as used herein, the terms "liquid-cooled structure", "liquid-cooled cold plate" and "liquid-cooled cold rail" refer to thermally conductive structures having one or more channels (or passageways) formed therein or passing therethrough, which facilitate the flow of liquid coolant through the structure. In one example, tubing is provided extending through the liquid-cooled cold plate or liquid-cooled cold rail. An "air-to-liquid heat exchanger" or "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchanger can vary without departing from the scope of the invention disclosed. Still further, "coolant-cooled structure" refers to, for example, a liquid-cooled structure or a heat exchanger, such as an air-to-liquid heat exchanger. A coolant-cooled structure comprises one or more coolant-carrying passages through which coolant circulates to dissipate heat from an electronics rack. A "data center" refers to a computer installation containing one or more electronics racks to be cooled. As a specific example, a data center may comprise one or more rows of rack-mounted computer units, such as server units.

One example of coolant used within the cooled electronic apparatuses disclosed herein is water. However, the concepts presented are readily adapted to use with other types of coolant. For example, the coolant may comprise a brine, a fluorocarbon liquid, a liquid metal, or other similar coolant, or refrigerant, while still maintaining the advantages and unique features of the present invention.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the rack unit. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise, in part, exhausted air from the "hot" aisles of the computer installation defined, for example, by opposing air outlet sides 130 of the electronics racks 110.

Figure 2:
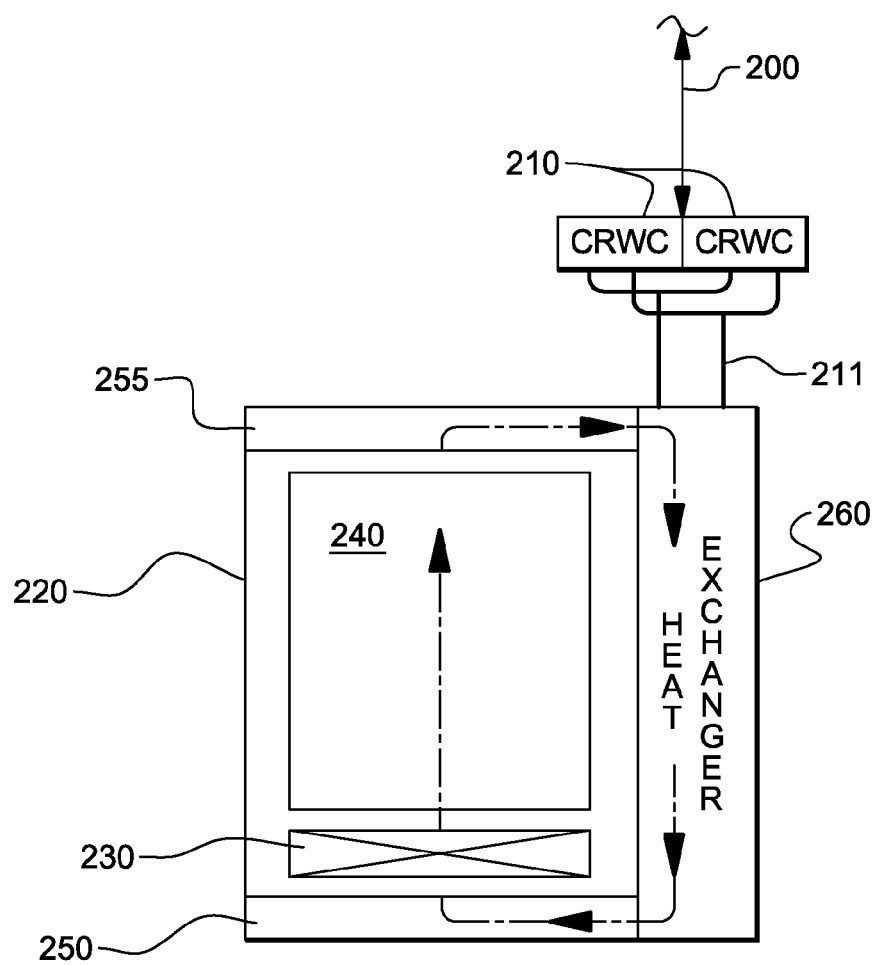
FIG. 2 is a cross-sectional plan view of one embodiment of an electronics rack with an attached air-to-liquid heat exchanger enhancing cooling of air passing through the electronics rack.
Figure 3:
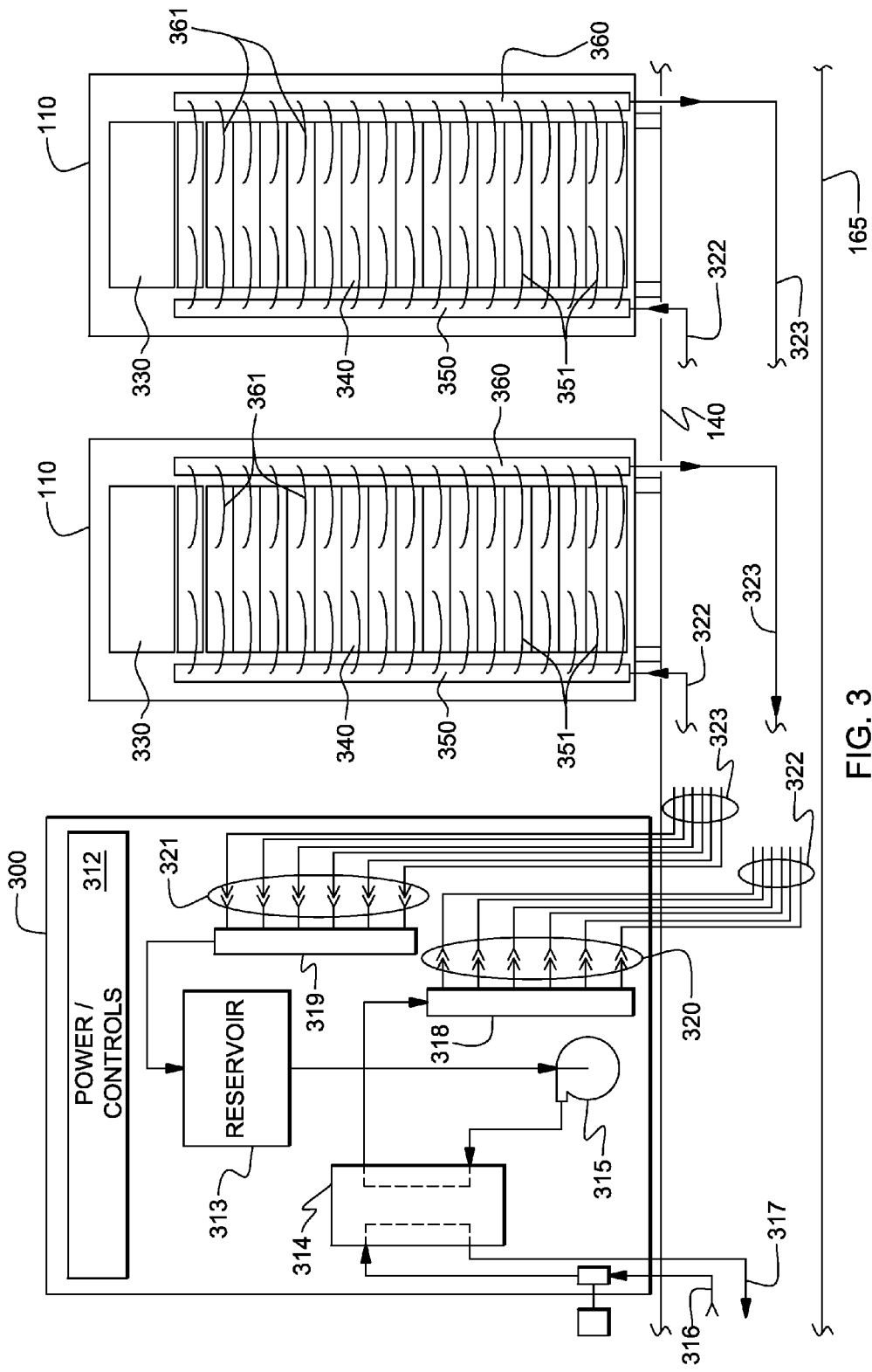
FIG. 3 depicts one embodiment of a data center with a coolant distribution unit facilitating liquid-cooling of one or more liquid-cooled electronics racks of the data center, in accordance with an aspect of the present invention.
Figure 4:
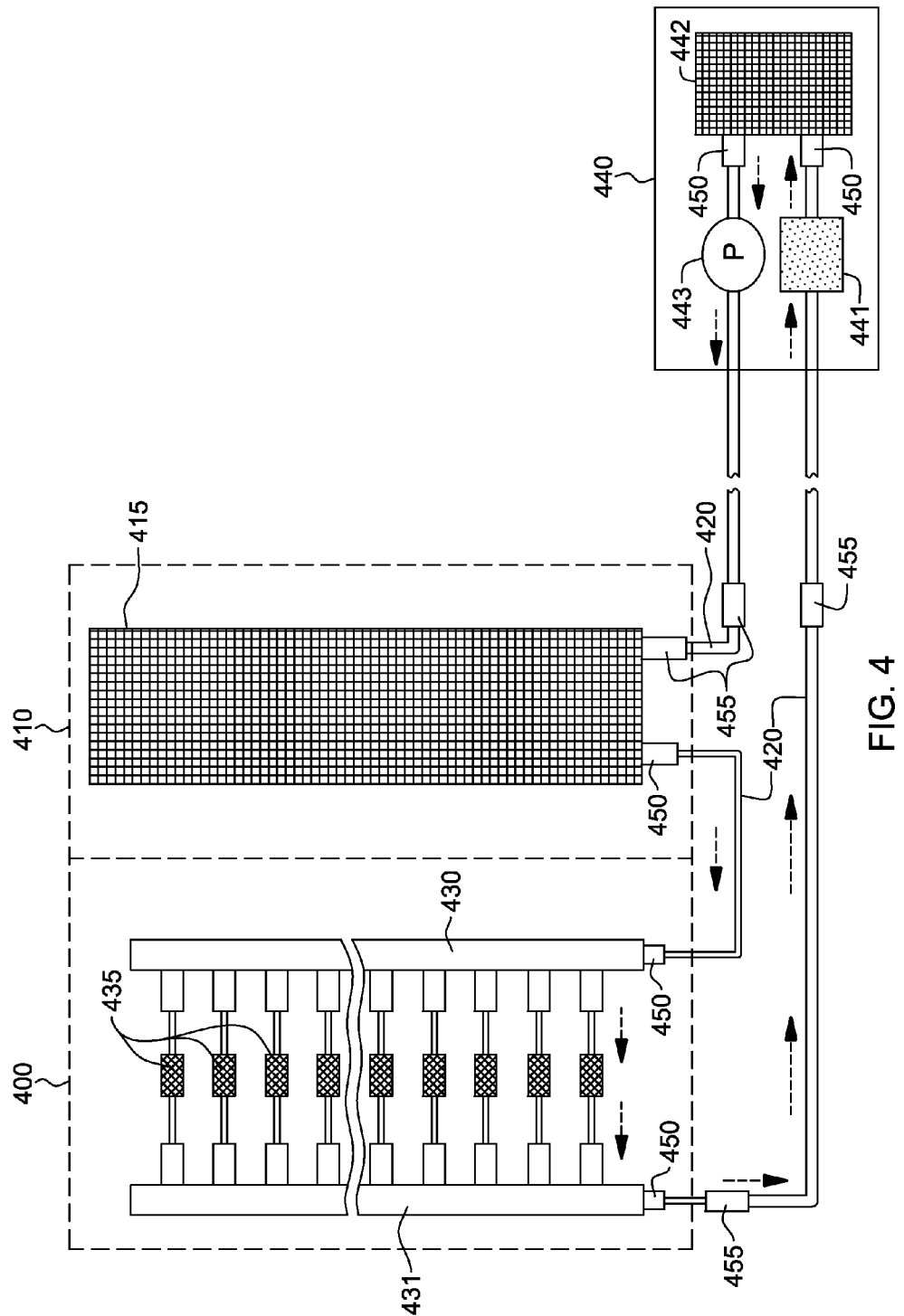
FIG. 4 depicts an alternate embodiment of a cooling apparatus and liquid-cooled electronics rack, in accordance with one or more aspects of the present invention.

Due to ever-increasing air flow requirements through electronics racks, and the limits of air distribution within a typical data center installation, liquid-based cooling is being combined with conventional air-cooling. FIGS. 2-4 illustrate various embodiments of a data center implementation employing a liquid-based cooling system.

FIG. 2 depicts one rack-level liquid-cooling solution which utilizes chilled facility water to remove heat from the computer installation room, thereby transferring the cooling burden from the air-conditioning unit(s) to the building's chilled water coolers. The embodiment depicted in FIG. 2 is described in detail in commonly assigned, U.S. Pat. No. 6,775,137. Briefly summarized, facility-chilled water 200 circulates through one or more liquid-to-liquid heat exchangers 210, coupled via a system coolant loop 211, to individual electronics racks 220 within the computer room. Rack unit 220 includes one or more air-moving devices 230 for moving air flow from an air inlet side to an air outlet side across one or more drawer units 240 containing heat-generating electronic components to be cooled. In this embodiment, a front cover 250 attached to the rack covers the air inlet side, a back cover 255 attached to the rack covers the air outlet side, and a side car disposed adjacent to (and/or attached to) the rack includes a heat exchanger 260 for cooling air circulating through the rack unit. Further, in this embodiment, the liquid-to-liquid heat exchangers 210 are multiple computer room water-conditioning (CRWC) units which are coupled to receive building chilled facility water 200. The building chilled facility water is used to cool the system coolant within system coolant loop 211, which is circulating through air-to-liquid heat exchanger 260. The rack unit in this example is assumed to comprise a substantially enclosed housing, wherein the same air circulates through the housing that passes across the air-to-liquid heat exchanger 260. In this manner, heat generated within the electronics rack is removed from the enclosed housing via the system coolant loop, and transferred to the facility coolant loop for removal from the computer installation room.

FIG. 3 depicts another embodiment of a rack-level, liquid-cooling solution, which again uses chilled facility water to remove heat from the computer installation room, thereby transferring the cooling burden from the air-conditioning unit(s) to the building's chilled water coolers. In this implementation, one embodiment of a coolant distribution unit 300 for a data center is illustrated. Within coolant distribution unit 300 is a power/control element 312, a reservoir/expansion tank 313, a liquid-to-liquid heat exchanger 314, a pump 315 (often accompanied by a redundant second pump), facility water inlet 316 and outlet 317 supply pipes, a supply manifold 318 supplying water or system coolant to the electronics racks 110 via couplings 320 and lines 322, and a return manifold 319 receiving water or system coolant from the electronics racks 110, via lines 323 and couplings 321. Each electronics rack includes (in one example) a power/control unit 330 for the electronics rack, multiple electronic systems or subsystems 340, a system coolant supply manifold 350, and a system coolant return manifold 360. As shown, each electronics rack 110 is disposed on raised floor 140 of the data center with lines 322 providing system coolant to system coolant supply manifolds 350 and lines 323 facilitating return of system coolant from system coolant return manifolds 360 being disposed in the supply air plenum beneath the raised floor.

In the embodiment illustrated, system coolant supply manifold 350 provides system coolant to cooling apparatuses disposed within the electronic systems or subsystems (for example, to liquid-cooled cold plates or cold rails) via flexible hose connections 351, which are disposed between the supply manifold and the respective electronic systems within the rack. Similarly, system coolant return manifold 360 is coupled to the electronic systems via flexible hose connections 361. Quick connect couplings may be employed at the interface between flexible hoses 351, 361 and the individual electronic systems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger, for example, disposed at an air outlet side thereof, which also receives system coolant from the system coolant supply manifold 350 and returns system coolant to the system coolant return manifold 360.

FIG. 4 illustrates another embodiment of a liquid-cooled electronics rack and cooling system therefor, in accordance with one or more aspects of the present invention. In this embodiment, the electronics rack 400 has a side car structure 410 associated therewith or attached thereto, which includes an air-to-liquid heat exchanger 415 through which air circulates from an air outlet side of electronics rack 400 towards an air inlet side of electronics rack 400, for example, in a closed loop path in a manner similar to that illustrated above in connection with the cooling implementation of FIG. 2. In this example, the cooling system comprises an economizer-based, warm-liquid coolant loop 420, which comprises multiple coolant tubes (or lines) connecting, in the example depicted, air-to-liquid heat exchanger 415 in series fluid communication with a coolant supply manifold 430 associated with electronics rack 400, and connecting in series fluid communication, a coolant return manifold 431 associated with electronics rack 400, a cooling unit 440 of the cooling system, and air-to-liquid heat exchanger 415.

As illustrated, coolant flowing through warm-liquid coolant loop 420, after circulating through air-to-liquid heat exchanger 415, flows via coolant supply plenum 430 to one or more electronic systems of electronics rack 400, and in particular, one or more cold plates and/or cold rails 435 associated with the electronic systems, before returning via coolant return manifold 431 to warm-liquid coolant loop 420, and subsequently to cooling unit 440 disposed (for example) outdoors from the data center. In the embodiment illustrated, cooling unit 440 includes a filter 441 for filtering the circulating liquid coolant, a condenser (or air-to-liquid heat exchanger) 442 for removing heat from the liquid coolant, and a pump 443 for returning the liquid coolant through warm-liquid coolant loop 420 to air-to-liquid heat exchanger 415, and subsequently to the liquid-cooled electronics rack 400. By way of example, hose barb fittings 450 and quick disconnect couplings 455 may be employed to facilitate assembly or disassembly of warm-liquid coolant loop 420.

As used herein, "warm liquid cooling" or "warm coolant cooling" refers to a cooling approach employing an outdoor-air-cooled heat exchange unit as the cooling unit 440. This heat exchange unit is coupled via, at least in part, warm-liquid coolant loop 420 to dissipate heat from the coolant passing through the cold plates and/or cold rails 435 associated with the electronic systems. In the embodiment depicted, the heat is dissipated from the coolant to outdoor ambient air. Thus, temperature of the coolant within warm-liquid coolant loop 420 is greater than the temperature of the outdoor ambient air to which heat is dissipated. By way of specific example, temperature of the coolant entering the liquid-cooled structures within the electronic system may be greater than or equal to 27° C. and less than or equal to 45° C. In one specific example of the warm coolant-cooling approach of FIG. 4, ambient temperature might be 30° C., and coolant temperature 35° C. leaving the air-to-liquid heat exchanger 442 of the cooling unit. The cooled electronic system depicted thus facilitates a chiller-less data center. Advantageously, such a liquid-cooling solution provides highly energy efficient cooling of the electronic systems of the electronics rack, using liquid (e.g., water), that is cooled via circulation through the air-to-liquid heat exchanger located outdoors (i.e., a dry cooler) with external ambient air being pumped through the dry cooler. Note that this warm coolant-cooling approach of FIG. 4 is presented by way of example only. In alternate approaches, cold coolant-cooling could be substituted for the cooling unit 440 depicted in FIG. 4. Such cold coolant-cooling might employ building chilled facility coolant to cool the liquid coolant flowing through the liquid-cooled electronics rack, and associated air-to-liquid heat exchanger (if present), in a manner such as described above in connection with FIGS. 2 & 3.

Figure 5B:
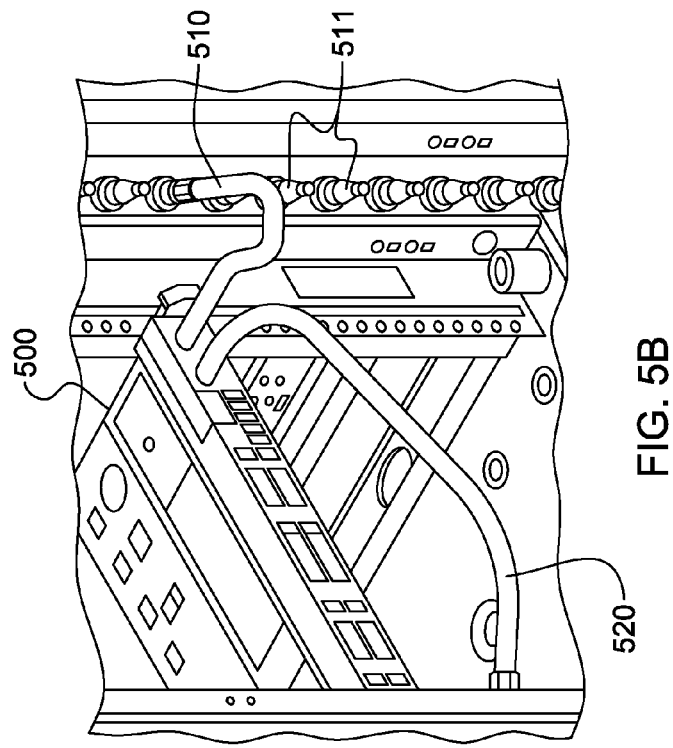
FIG. 5B is a partial depiction of a more detailed embodiment of the rack-level coolant distribution structures illustrated in FIG. 5A, in accordance with one or more aspects of the present invention.
Figure 5A:
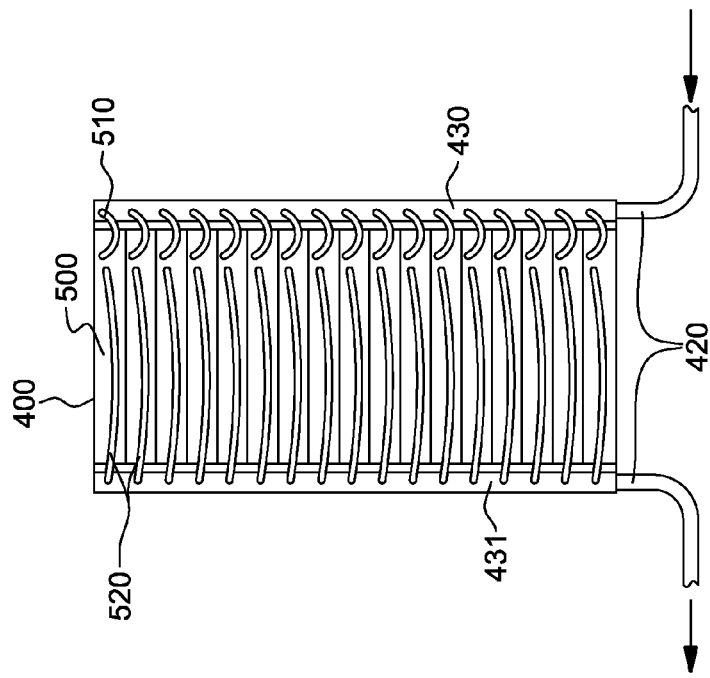
FIG. 5A is a more detailed, elevational view of one embodiment of the liquid-cooled electronics rack of FIG. 4, and illustrating rack-level coolant distribution structures, in accordance with one or more aspects of the present invention.

FIGS. 5A & 5B depict in greater detail one embodiment of a liquid-cooled electronics rack, such as depicted in FIG. 4, in accordance with one or more aspects of the present invention. In this implementation, liquid-cooled electronics rack 400 comprises a plurality of electronic systems 500, within which one or more electronic components are to be liquid-cooled via, for example, one or more cold plates or cold rails, as described below. The cooling system includes coolant loop 420 coupled in fluid communication with coolant supply manifold 430 and coolant return manifold 431, both of which may comprise vertically-oriented manifolds attached to liquid-cooled electronics rack 400. In this embodiment, the rack-level coolant distribution system further includes individual node-level supply hoses 510 supplying coolant from coolant supply manifold 430 to cold plates and cold rails within the electronic systems 500. As shown in FIG. 5B, coolant supply manifold 430 may be (in one embodiment) a vertically-oriented manifold with a plurality of coupling connections 511 disposed along the manifold, one for each electronic system 500 having one or more electronic components to be liquid-cooled. Coolant leaves the individual electronic systems 500 via node-level return hoses 520, which couple the individual electronic systems (or nodes) to coolant return manifold 431, and hence, to coolant loop 420. In the embodiment illustrated in FIG. 4, relatively warm-liquid coolant, such as water, is supplied from the cooling unit, either directly, or through one or more air-to-liquid heat exchanger(s) 415 (of FIG. 4), and hot coolant is returned via the coolant return manifold to the cooling unit. In one embodiment of the rack-level coolant distribution system illustrated in FIGS. 5A & 5B, the node-level supply and return hoses 510, 520 are flexible hoses.

Figure 6:
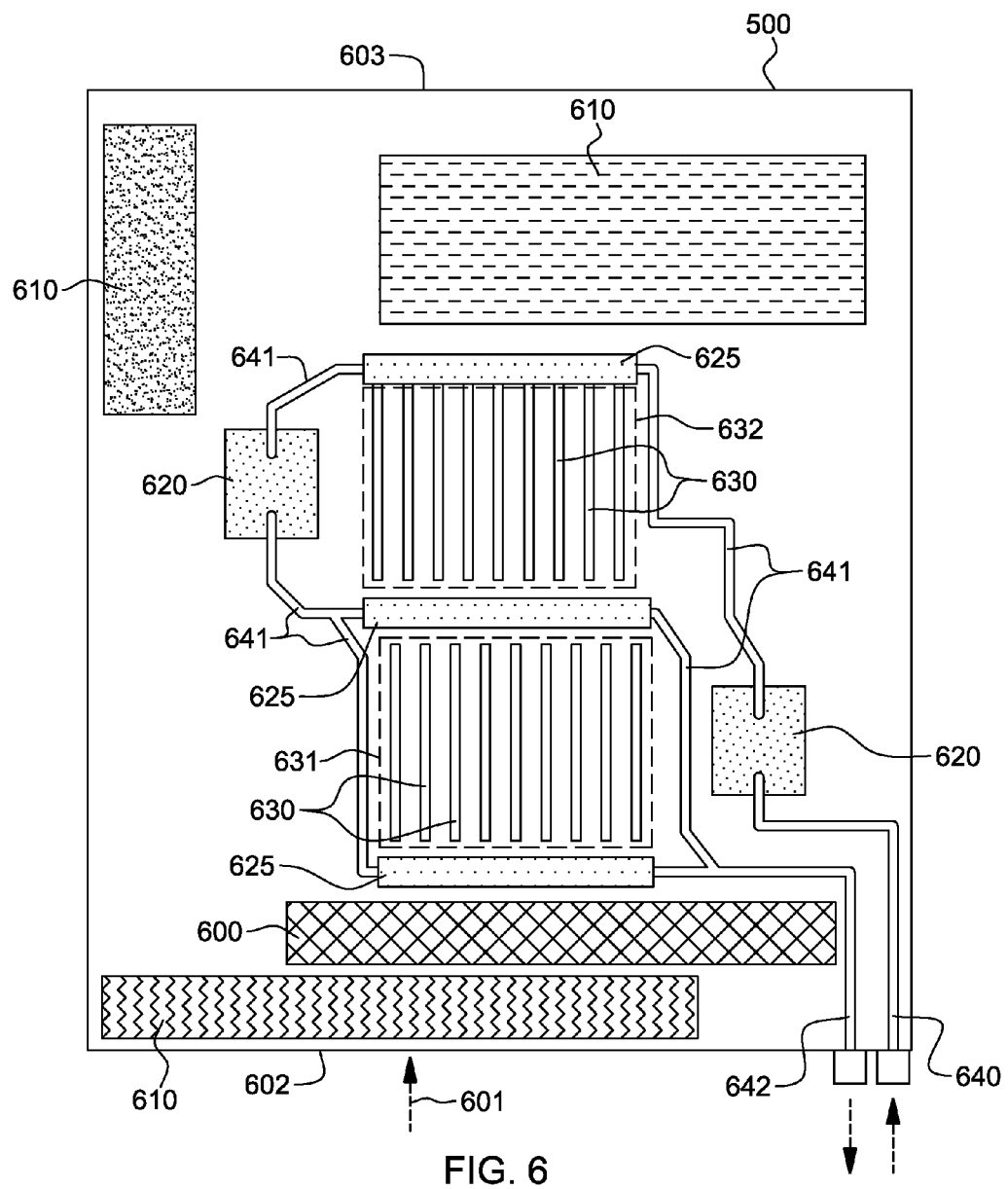
FIG. 6 is a plan view of one embodiment of an electronic system layout for a liquid-cooled electronics rack, and illustrating multiple liquid-cooled cold plates and multiple liquid-cooled cold rails coupled in fluid communication, in accordance with one or more aspects of the present invention.

FIG. 6 illustrates one embodiment of a cooled electronic system 500 component layout, wherein one or more air-moving devices 600 provide forced air flow 601 to cool multiple components 610 within electronic system 500. Cool air is taken in through a front 602 and exhausted out a back 603 of the electronic system (or drawer). The multiple components to be cooled include, for example, multiple processor modules to which liquid-cooled cold plates 620 (of the liquid-based cooling apparatus) are coupled, as well as multiple arrays 631, 632 of electronics cards 630 (e.g., memory modules such as dual in-line memory modules (DIMMs)), which are to be thermally coupled to one or more liquid-cooled cold rails 625. As used herein "thermally coupled" refers to a physical thermal transport path being established between components, for example, between an electronics card and a liquid-cooled cold rail for the conduction of heat from one to the other.

The illustrated liquid-based cooling approach further includes multiple coolant-carrying tubes connecting in fluid communication liquid-cooled cold plates 620 and liquid-cooled cold rails 625. These coolant-carrying tubes comprise (for example), a coolant supply tube 640, multiple bridge tubes 641, and a coolant return tube 642. In the embodiment illustrated, bridge tubes 641 connect one liquid-cooled cold rail 625 in series between the two liquid-cooled cold plates 620, and connect in parallel two additional liquid-cooled cold rails 625 between the second liquid-cooled cold plate 620 and the coolant return tube 642. Note that this configuration is provided by way of example only. The concepts disclosed herein may be readily adapted to use with various configurations of cooled electronic system layouts. Note also, that as depicted herein, the liquid-cooled cold rails are elongate, thermally conductive structures comprising one or more channels through which liquid coolant passes, for example, via one or more tubes extending through the structures. The liquid-cooled cold rails are disposed, in the embodiment illustrated, at the ends of the two arrays (or banks) 631, 632 of electronics cards 630, and multiple thermal spreaders are provided coupling in thermal communication electronics cards 630 and liquid-cooled cold rails 635.

FIGS. 7A-7D depict various alternate embodiments of a cooled electronic system, in accordance with one or more aspects of the present invention. These cooled electronic system comprise various embodiments of a cooling apparatus which include dynamic control and limiting of energy consumed by the cooling apparatus, as described hereinbelow.

Generally stated, disclosed herein is a cooling apparatus which includes one or more coolant-cooled structures, such as one or more liquid-cooled structures (or cold plates) and/or one or more air-to-liquid heat exchangers, associated with an electronics rack for facilitating dissipation of heat from the electronics rack in a manner, for example, such as described above in connection with FIG. 4. The one or more coolant-cooled structures include one or more coolant-carrying passages. The cooling apparatus further includes a coolant loop coupled in fluid communication with the coolant-carrying passage(s) of the coolant-cooled structure(s) and one or more heat exchange units coupled to facilitate heat transfer from coolant within the coolant loop. In one embodiment, the heat exchange unit(s) is coupled in fluid communication with the coolant loop. The cooling apparatus further includes N controllable components associated with at least one of the coolant loop or the at least one heat exchange unit to facilitate at least one of circulating of coolant through the coolant loop or transfer of heat from the coolant via the heat exchange unit(s), wherein $N \geq 1$. Further, a controller is coupled to the N controllable components. The controller dynamically adjusts operation of the N controllable components, based on Z input parameters and one or more specified constraints, to provide a specified cooling to the at least one coolant-cooled structure, while limiting energy consumed by the N controllable components, wherein $Z \geq 1$. In one embodiment, the Z input parameters comprise Z measured input parameters, which may be dynamically-varying inputs or variables ascertained by the controller. By way of example, the input parameters may comprise temperature readings, pressure readings, humidity readings, dew point readings, etc.

In the cooled electronic system embodiments of FIGS. 7A-7D, an air-side, economizer-based data center is depicted, which is implemented with a control process to limit data center cooling power consumption, in accordance with one or more aspects of the present invention. An air-side, economizer-based data center cooling system includes one or more electronics racks which are partially or completely liquid-cooled, as well as, in one embodiment, a side car structure, an air-side economizer (i.e., heat exchange unit), and one or more optional liquid-to-liquid heat exchange buffers (depicted in FIGS. 7B-7D). In one embodiment, substantially all the heat dissipated by the electronic components within the electronics rack is transferred to the liquid coolant; for example, partially within the electronics rack via one or more liquid-cooled structures, and partially at the side car structure, via an air-to-liquid heat exchanger. This heat is then convected to the air-side economizer, where it is dissipated to the outdoor ambient air. The rate of heat transfer at the electronics rack(s) is predominantly governed by the coolant flow rate through the coolant-cooled structure(s). At the economizer side, the heat transfer rate is governed by the economizer air-side flow rate and the liquid-coolant flow rate through the economizer. The heat transfer rate is a non-linear, monotonically increasing function of air-side flow rate and liquid coolant flow rate.

For any given economizer design, there is a limit to the air-side flow rate and liquid coolant flow rate. These limits would typically be used to guide the economizer selection to meet maximum cooling requirements (i.e., worst case scenario cooling requirements) by a safe margin. As used herein, worst case scenario refers to the highest ambient air temperature and highest heat dissipation at the electronics rack, and in a more general sense, the highest heat dissipation within the data center, occurring simultaneously. This situation is rare, and might not even occur over the lifecycle of the data center. The typical result is a relatively high (more than required) cooling power consumption for almost the entire lifecycle of the data center. Hence, disclosed hereinbelow are dynamic control processes, based on data center heat dissipation and, for example, ambient air temperature, which minimize (in one embodiment) the cooling power consumption, and thereby reduce the data center energy usage.

As noted, FIGS. 7A-7D depict alternate embodiments of a cooled electronic system, in accordance with one or more aspects of the present invention, each comprising one or more electronics racks and a cooling apparatus such as described herein.

Figure 7A:
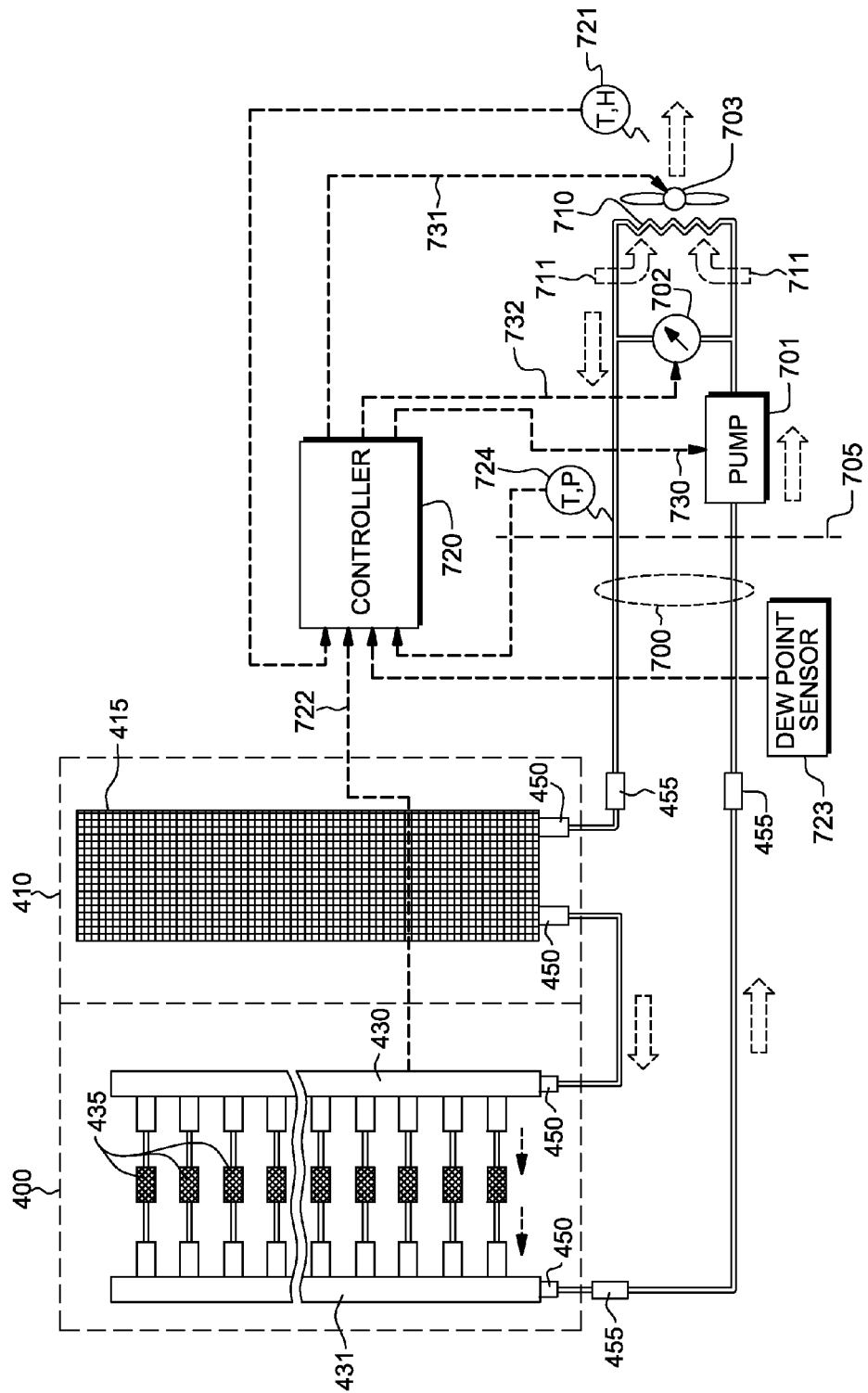
FIG. 7A is a schematic of a cooled electronic system comprising one embodiment of a cooling apparatus, in accordance with one or more aspects of the present invention.

FIG. 7A depicts one embodiment of a single coolant loop configuration which includes one or more electronics racks 400, each with a side car structure 410 associated therewith or attached thereto, which includes an air-to-liquid heat exchanger 415 through which air circulates from an air outlet side of electronics rack 400 towards an air inlet side of electronics rack 400, for example, in a closed loop path in a manner similar to that illustrated above in connection with the cooling implementation of FIG. 2. In this example, the cooling system comprises an economizer-based, warm-liquid coolant loop 700, which comprises multiple coolant tubes (or lines) connecting, in the example, depicted, air-to-liquid heat exchanger 415 in series fluid communication with a coolant supply manifold 430 associated with electronics rack 400, and connecting in series fluid communication a coolant return manifold 431 associated with electronics rack 400, and a coolant loop 700. By way of example, hose barb fittings 450 and quick disconnect couplings 455 may be employed to facilitate assembly or disassembly of coolant loop 700. Coolant loop 700 includes a coolant pump 701 and is coupled in fluid communication with a heat exchange unit 710, which in the depicted embodiment, comprises a dry cooler, wherein ambient air 711 is forced across the heat exchange unit 710 via one or more fans 703. An electronically-controlled bypass valve 702 is coupled in parallel with heat exchange unit 710 to allow controlled bypassing of coolant within the coolant loop from passing through the heat exchange unit.

As illustrated, coolant flowing through warm-liquid coolant loop 700, after circulating through air-to-liquid heat exchanger 415, flows via coolant supply plenum 430 to one or more electronic systems of electronics racks 400, and in particular, one or more liquid-cooled cold structures 435 associated with the electronic systems, before returning via coolant return manifold 431 to coolant loop 700, and subsequently, to heat exchange unit 710 disposed (for example) outdoors from a data center wall 705. In the embodiment illustrated, the heat exchange unit may include a filter (not shown) for filtering the circulating liquid coolant, as well as an air-to-liquid heat exchanger for removing heat from the liquid coolant. Note in the single-loop, cooled electronic system example of FIG. 7A, air-to-liquid heat exchanger 415 and liquid-cooled cold structures 435 are examples of coolant-cooled structures associated with the electronics rack for facilitating dissipation of heat from the electronics rack. Additionally, controllable components associated with at least one of the coolant loop 700 or the at least one heat exchange unit 710 include coolant pump 701, fan 703, and recirculation (or bypass) valve 702.

Note that as used herein, "warm-liquid cooling" or "warm-coolant cooling" refer to a cooling approach employing an outdoor-air-cooled heat exchange unit. This heat exchange unit is coupled via, at least in part, coolant loop 700 to dissipate heat from the coolant passing through the coolant-cooled structures 435, 415 associated with the electronic systems. In the embodiment depicted, this heat is dissipated from the coolant to outdoor ambient air. Thus, temperature of the coolant within warm-liquid coolant loop 700 is greater than the temperature of the outdoor ambient air to which heat is dissipated. By way of specific example, temperature of coolant entering the liquid-cooled structures within the electronic systems may be greater than or equal to 27° C., and less than or equal to 45° C. The cooled electronic system depicted in FIG. 7A thus facilitates a chiller-less data center. Advantageously, such a liquid-cooling solution provides highly energy efficient cooling of the electronic systems of the electronics rack, using liquid (e.g., water) that is cooled via circulation through the heat exchange unit(s) 710 located outdoors (i.e., a dry cooler) with external ambient air 711 being pumped through the dry cooler. Note that this single loop, warm-cooling approach of FIG. 7A is presented by way of example, only. Several alternative approaches are depicted in FIGS. 7B-7D, and described below.

As illustrated in FIG. 7A, a controller 720 is also provided as part of the cooling apparatus. For the single loop configuration of FIG. 7A, input parameters to controller 720 may include ambient temperature and humidity 721, temperature of one or more electronic components 722, such as processor, memory or hard drive components, a dew point sensor 723 within the data center, and temperature and pressure 724 of coolant within the coolant loop 700, for example, temperature and pressure of coolant being provided to the air-to-liquid heat exchanger 415 of the side car structure 410 in the embodiment illustrated in FIG. 7A. As noted, in this embodiment, the N controllable components include coolant pump(s) 701, fans(s) 703, and electronically-controlled bypass valve 702. Controller 720 provides a corresponding operational setting to each of these components as described herein via control lines 730, 731, 732, respectively. In one example, the operational control setting for coolant pump(s) 701 might comprise an RPM value, the operational setting for fan(s) 703 might comprise a different RPM value, and an operational setting for bypass valve 702 might comprise a percent (%) open parameter, which controls the positioning of the valve. Depending on the control process implemented by controller 720, other input parameters, or other output operational control settings, may be employed or provided.

Figure 7B:
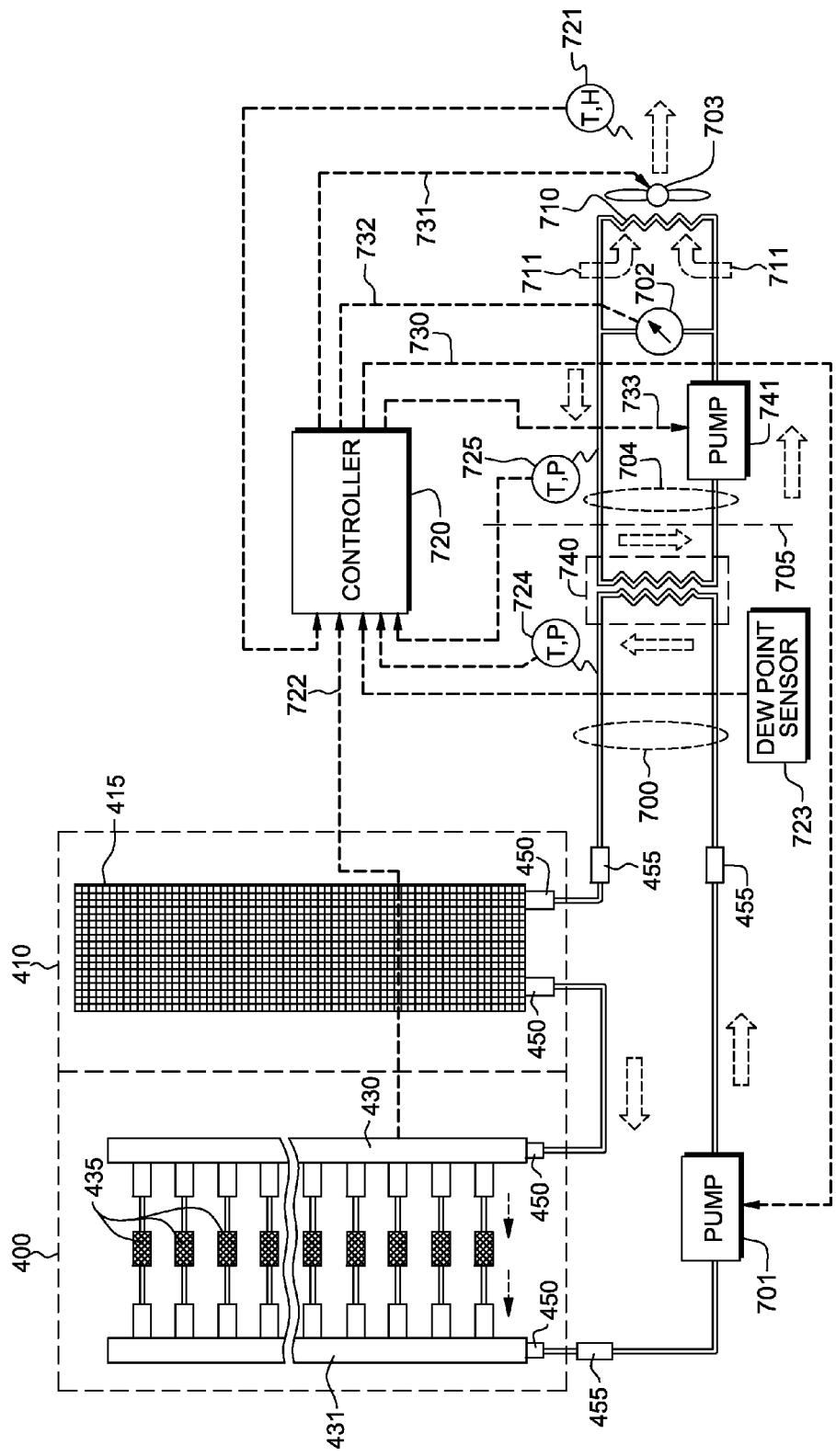
FIG. 7B is a schematic of a cooled electronic system comprising another embodiment of a cooling apparatus, in accordance with one or more aspects of the present invention.

FIG. 7B depicts a dual-loop cooling apparatus embodiment, which is similar to the single loop embodiment described above in connection with FIG. 7A, except that a liquid-to-liquid heat exchanger 740 is provided within the data center as a buffer to coolant flowing through coolant loop 700 and a secondary coolant flowing through heat exchange unit 710. This advantageously allows, for example, water to be employed within coolant loop 700, and a different coolant (for example, a water glycol mixture) to be employed within secondary coolant loop 704 coupling in fluid communication liquid-to-liquid heat exchanger 740 and heat exchange unit 710. Additional components for the cooling apparatus of FIG. 7B include a second pump 741 associated with secondary coolant loop 704, coupling in fluid communication liquid-to-liquid heat exchanger 740 and heat exchange unit 710, and an additional temperature and pressure sensor 725 for sensing temperature and pressure of coolant within secondary coolant loop 704. In addition, controller 720 of the cooling apparatus of FIG. 7B provides, via a control line 733, an output operational control setting for the second coolant pump 741 in addition to those operational control settings provided in connection with the embodiment of FIG. 7A.

Figure 7C:
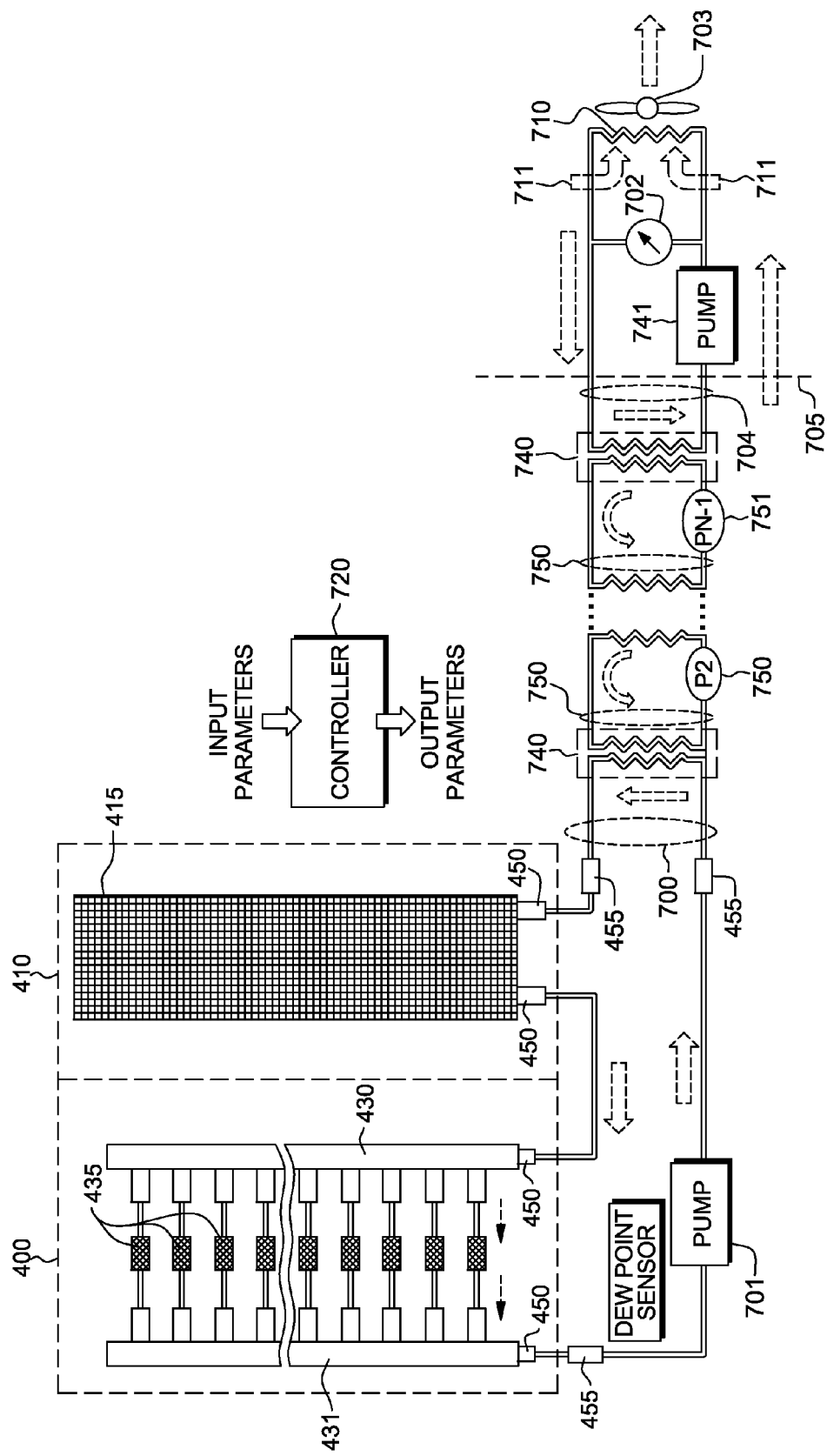
FIG. 7C is a schematic of a cooled electronic system comprising a further embodiment of a cooling apparatus, in accordance with one or more aspects of the present invention.
Figure 7D:
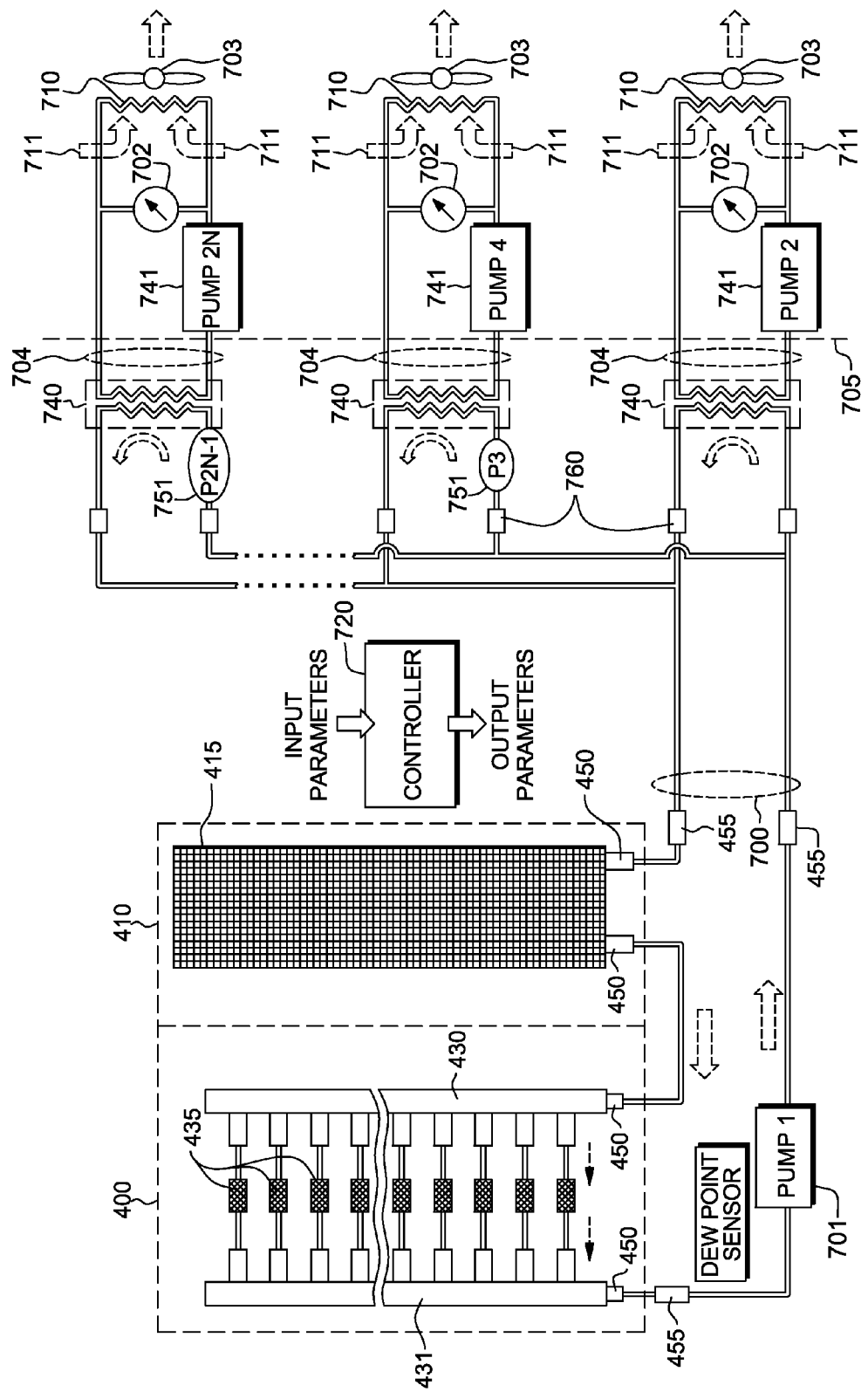
FIG. 7D is a schematic of a cooled electronic system comprising another embodiment of a cooling apparatus, in accordance with one or more aspects of the present invention.

FIG. 7C depicts a further cooling apparatus embodiment, wherein multiple heat exchangers 740 are coupled in series between coolant loop 700 and heat exchange unit 710. These heat exchangers may each comprise a liquid-to-liquid heat exchanger, a liquid-to-gas heat exchanger, or even a gas-to-gas heat exchanger. Additionally, the cooling apparatus of FIG. 7C includes additional cooling pumps 751, each associated with a respective coolant loop 750 coupling two coolant-to-coolant heat exchangers 740. Controller 720 includes similar temperature and pressure sensors for determining temperature and pressure of coolant within each coolant loop 700, 750, 704, and outputs operational control settings for the additional controllable components comprising coolant pumps 751, in addition to the above-discussed controllable components.

FIG. 7D depicts an alternate cooling apparatus embodiment, wherein the additional coolant loops are coupled in parallel rather than in series, as depicted in FIG. 7C. In this embodiment, coolant loop 700 is coupled via multiple parallel-connected, coolant-to-coolant heat exchangers 740 to multiple heat exchange units 710 via respective secondary coolant loops 704, and secondary coolant pumps 741. In addition to coolant pumps 701, 741, coolant pumps 751 are provided, if desired, for supplemental coolant pumping through the parallel-connected, coolant-to-coolant heat exchangers 740. In the embodiment illustrated in FIG. 7D, each secondary coolant loop 704 includes a respective coolant pump 741, and a respective heat exchange unit 710, as well as one or more fans 703 associated with the heat exchange unit, and an electronically-controlled bypass valve 702 for selectively bypassing a portion of the secondary coolant from the heat exchange unit 710. Quick connect couplings 760 may be employed to facilitate assembly or disassembly of the cooling apparatus illustrated.

Note that FIGS. 7C & 7D depict cooling apparatuses wherein the RPMs of a plurality of economizer fans, and a plurality of coolant pumps are regulated individually, or simultaneously, to limit or optimize data cooling energy consumption, and subsequently, to reduce the total data center energy consumption.

Proposed herein are various control processes for, for example, an air-side, economizer-based data center cooling approach such as depicted in FIGS. 7A-7D, which can be implemented to optimize or limit power consumption of the data center cooling. The control process embodiments presented herein (by way of example only) are based on regulating, for example, the economizer fan RPMs, as well as the coolant pump(s) RPMs, and in certain embodiments, one or more flow control valve settings. These operational settings are regulated based on Z input parameters, which may include various input conditions or parameters, such as outdoor ambient air temperature and humidity, data center temperature and humidity, temperature of one or more electronic components within the electronics rack being cooled, temperature and pressure of one or more coolants within the cooling apparatus, flow rates through one or more cooling loops, as well as a dew point of the data center. For example, if one or more economizer fans are running at maximum RPMs for 40° C. ambient air, and a maximum heat load dissipation at the electronics rack, they may run at a lower RPM (for example, 50% of max RPMs), at a lower ambient air temperature (for example, 20° C.). This can reduce the fan power consumption by 87.5% of maximum. Note that the power consumption for a fan, as well as for a coolant pump, follows a cubic relationship with the corresponding operational RPMs. In other words, by reducing the fan's RPMs by 50%, fan power consumption reduces by 87.5%. In a more general sense, RPMs of N number of economizer fans, and M number of coolant pumps, can be dynamically regulated simultaneously to reduce or limit the data center cooling energy, and subsequently reduce the total data center energy consumption.

Figure 8A:
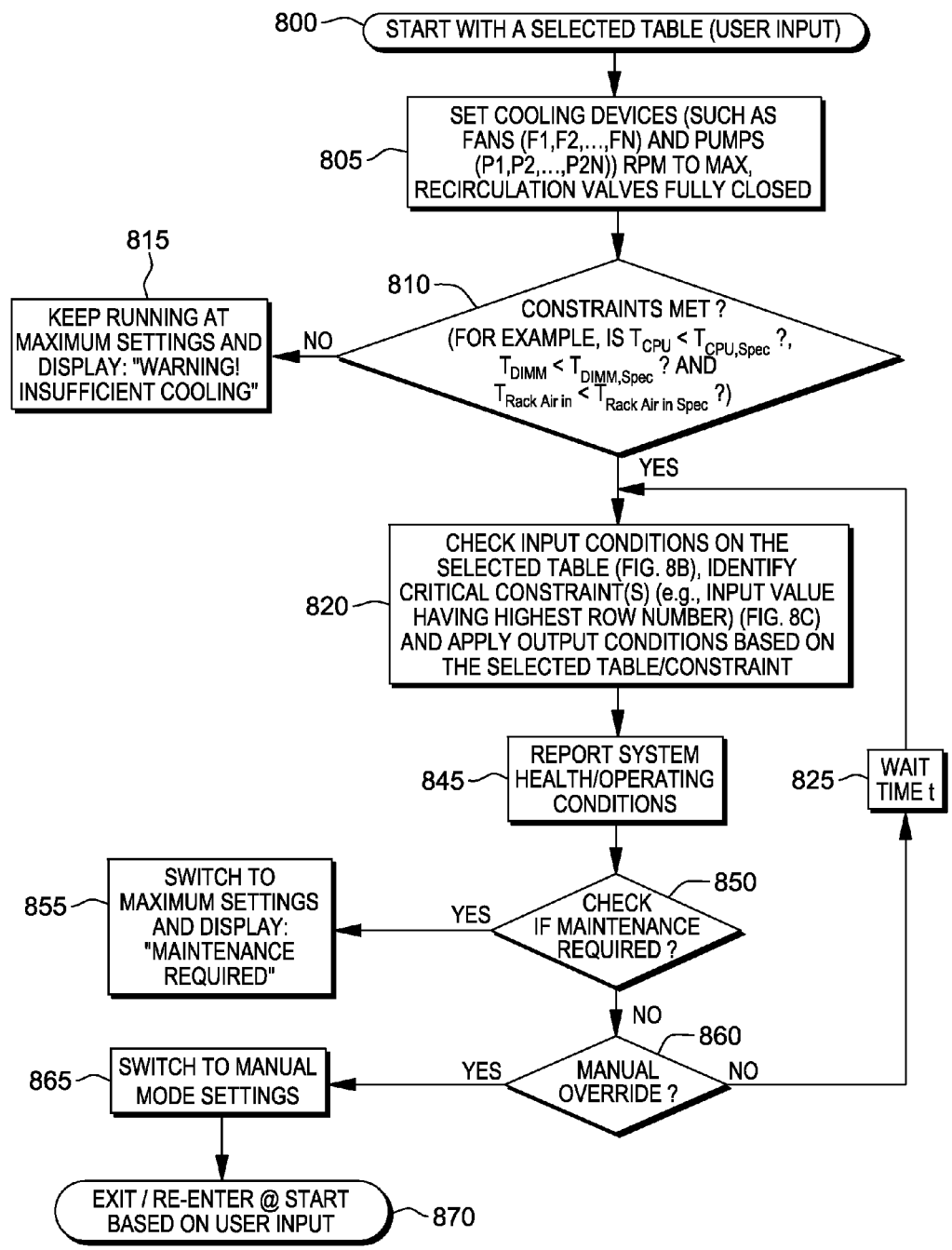
FIG. 8A is a flowchart of one embodiment of a control process for a cooling apparatus, such as one of the cooling apparatuses depicted in FIGS. 7A-7D, in accordance with one or more aspects of the present invention.
Figure 8C:
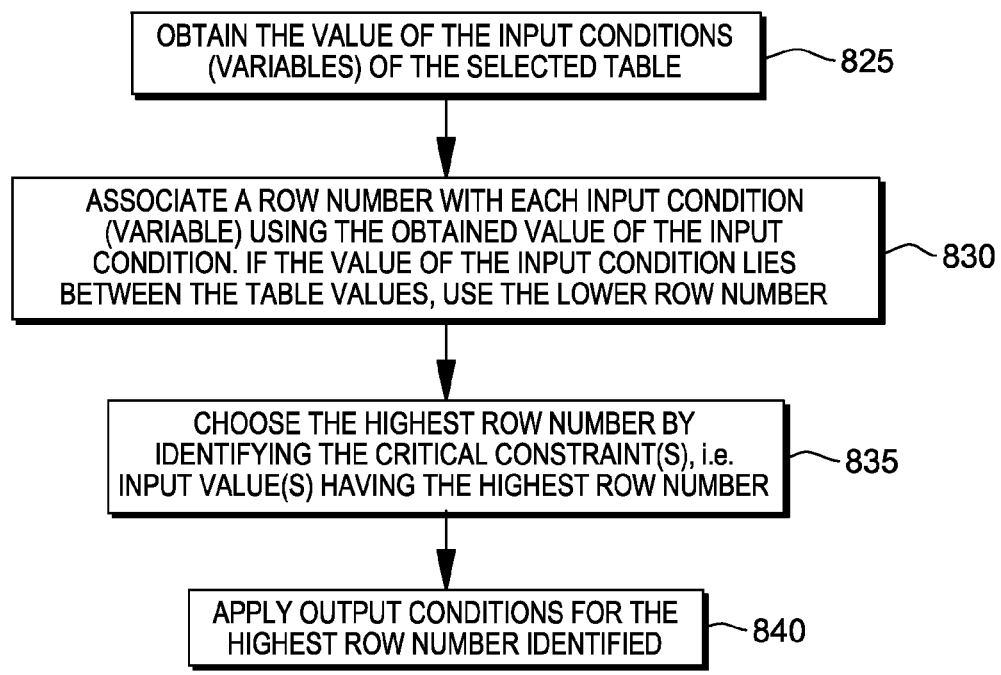
FIG. 8C is a flowchart of one embodiment of a process for selecting a critical constraint for use in the control process of FIGS. 8A & 8B, in accordance with one or more aspects of the present invention.

FIGS. 8A-8C depict one embodiment of a control process which can be employed to minimize data center cooling power consumption, in accordance with one or more aspects of the present invention. This control process comprises a data structure or table-based control approach, as explained below.

Control processing begins with a selected, prespecified data structure (or table) being provided to the control process 800, one embodiment of which is depicted in FIG. 8B. Controllable components such as fans and coolant pumps are initially set with a maximum RPM, and any recirculation valves are fully closed 805. By design, all specified constraints for the operation of the cooling apparatus should be satisfied 810. By way of example, determining whether constraints are met might comprise determining whether temperature of an electronic component, such as a processor, is less than a specified temperature ($T_{CPU} < T_{CPU,spec}$?), determining whether temperature of an associated memory module, such as a dual in-line memory module, is less than a specified, dual in-line memory module temperature ($T_{DIMM} < T_{DIMM,spec}$?), and/or determining whether air inlet temperature to the electronics rack is less than a specified air inlet temperature to the electronics rack ($T_{rack\ air\ in} < T_{rack,\ air\ in,\ spec}$?). If "no", then a warning message of insufficient cooling is displayed, and the controller maintains the controllable components at their maximum operational control settings 815.

If the specified constraints are satisfied, then the Z input parameters for the selected, specified table are checked to ascertain a critical constraint 820. As illustrated in FIG. 8B, the table may comprise "r" number of rows, and "Z" number of input parameters (or conditions). The input parameters (or conditions) could be any or all of the monitored variables, such as the temperatures, pressures, humidity, flow rates, and power consumption at various locations within the cooled electronic system. The output conditions in the table are the operational control settings for, for example, fans and coolant pumps, as well as any recirculation valve positions. In case of a single input condition, there is no need to identify the critical constraint, and the valve setting(s) and the output condition(s) can be assigned defined in the table.

For the case of two or more input conditions, the critical constraint is identified before applying values of the output conditions. Based on the actual value of the monitored input parameters, each input can be assigned a row number. The input condition having the highest row number is, in one embodiment, the critical constraint. For example, let there be two input conditions, I1 and I2, and let their actual monitored values be I1,x and I2,x. With the selected table, the value I1,x could be between the table values of I1,r1 and I1,r2 (where row r1<r2), while the value I2,x could be between the values of I2,r3 and I2,r4 (where row r3<r4). If input I1 were selected as the constraint, the corresponding row number would be r1, whereas if I2 is selected as the constraint, the corresponding row number would be r3. If r3>r1, then input I2 would be the critical condition, otherwise, input I1 would be the critical constraint. If r1=r3, then both the inputs are critical constraints. Once the critical constraints are identified, the set of operational control settings (or output conditions to be applied) are identified from the table. FIG. 8C depicts one embodiment of this process.

As illustrated in FIG. 8C, the controller obtains a value for each input parameter (or condition) in the selected table 825, and associates a row number with each input parameter using the obtained values of the input parameters 830. If the value of the obtained input parameter lies between two table values, then the lower row number is employed. The controller then chooses the highest row number by identifying the critical constraint(s), i.e., in one embodiment, the input parameter value(s) having the highest row number 835. The corresponding set of operational control settings (or output conditions) in this row of the plurality of rows in the specified table, are then applied, based on the highest row number identified 840.

Referring to FIG. 8A, the health/operating conditions of the cooled electronic system may next be reported 845. For example, temperature, pressure, humidity, flow rates, power consumption, valve positions, etc., can be reported or displayed to reflect the outcome of the applied set of operational control settings (or output conditions). The controller may check if maintenance is required 850. For example, maintenance may be required based on hours of system operation, or any similar condition. If "yes", then a "maintenance required" message may be displayed, and processing may switch to maximum operational control settings 855. If "no", then processing continues in normal operation, which may include a check for whether a manual override has been made 860. If there is a manual override, then the system will switch to manual mode settings 865, and continue to run in the manual mode until user input is provided to reenter the control loop 870. If there is no manual override, then the system will continue normal operation, and the controller will, after waiting a time interval t 825, return to check the current input parameters on the selected table 820.

Note that the table values comprising the input parameters and sets of operational control settings may be determined through experimental testing in a lab environment. The loop configuration can be initially installed such that the dry cooler receives a supply of air at a controlled temperature. This can be carried out using an air heater apparatus upstream of the dry cooler, and by initially having the dry cooler located indoors to facilitate testing before transferring to an outdoor environment. The air heater apparatus can comprise an electrical, resistance-based heater, that is conductively coupled to metal heat sinks and fans being used to force air through the heated heat sinks. Alternatively, an air-to-liquid heat exchanger with a water heater fluidically coupled to the water loop of the heat exchanger could be used as the air heater apparatus. Some level of heated air ducting from the air heated apparatus to the inlet of the air side of the dry cooler heat exchanger coils may be required.

Once a controllable air heater apparatus is in place, the system can be started, that is, the coolant pumps and fans and the IT load, and finally the air heater apparatus, may be activated. The coolant pumps and fans can be set to their maximum speeds, and the IT load can be ramped up slowly to maximum load condition. After steady state is reached (i.e., after the temperatures stabilize), air temperatures at the inlet to the dry cooler heat exchanger coils can be measured and compared to the highest temperature expected annually, based on local weather data. If the inlet air temperature to the dry cooler coil is less than the maximum air temperature expected based on local weather conditions (as would be likely for most of the year), the heaters are switched ON and controlled until the maximum air inlet temperature condition at the inlet to the dry cooler is met. The cooling apparatus is run at these conditions until steady state is reached.

After steady state is reached, the speeds of the various coolant pumps and fans are ramped down slowly in small increments from their maximum speed. While reducing the fan and pump speeds, the speed of each coolant pumping device can be reduced in small steps that are related to each other, that is, using a factor, or the speeds can be reduced individually using a fixed percentage change between the maximum and minimum allowable pump or fan speeds. After each decrement of the pump and fan speeds, steady state is allowed to be reached and various device and coolant temperatures of interest are recorded.

The table generated using the experiments described above then provides a guiding relationship between the coolant and device temperatures and the fan and pump speeds, while assuming a maximum IT load and a maximum inlet air temperature to the dry cooler heat exchanger coil. The use of the maximum IT load and dry cooler air inlet temperatures results in a conservative control of the system with respect to the pump and fan flow rates. However, cooling energy efficiency is achieved using the rational reduction of pump and fan speeds for lower coolant or device temperatures. Further, experiments can be carried out to parametrically test various factors that relate the fan and pump speeds to each other. Alternatively, various individual profiles for decreasing the individual coolant pumps and fans could be tested. After a matrix of tests has been performed, the most energy efficient (i.e., best performing) parameter inputs to the table can be determined and chosen. If seasonal sensitivity is desired, a typical day for different seasons (i.e., fall, winter, spring and summer) can be created using the controllable air heater apparatus and data obtained as the equipment speeds are varied using the methods outlined to generate a season-specific table. After satisfactory experimentation, the dry cooler can be commissioned and the coolant loop can be allowed to become fully operational.

Figure 9A:
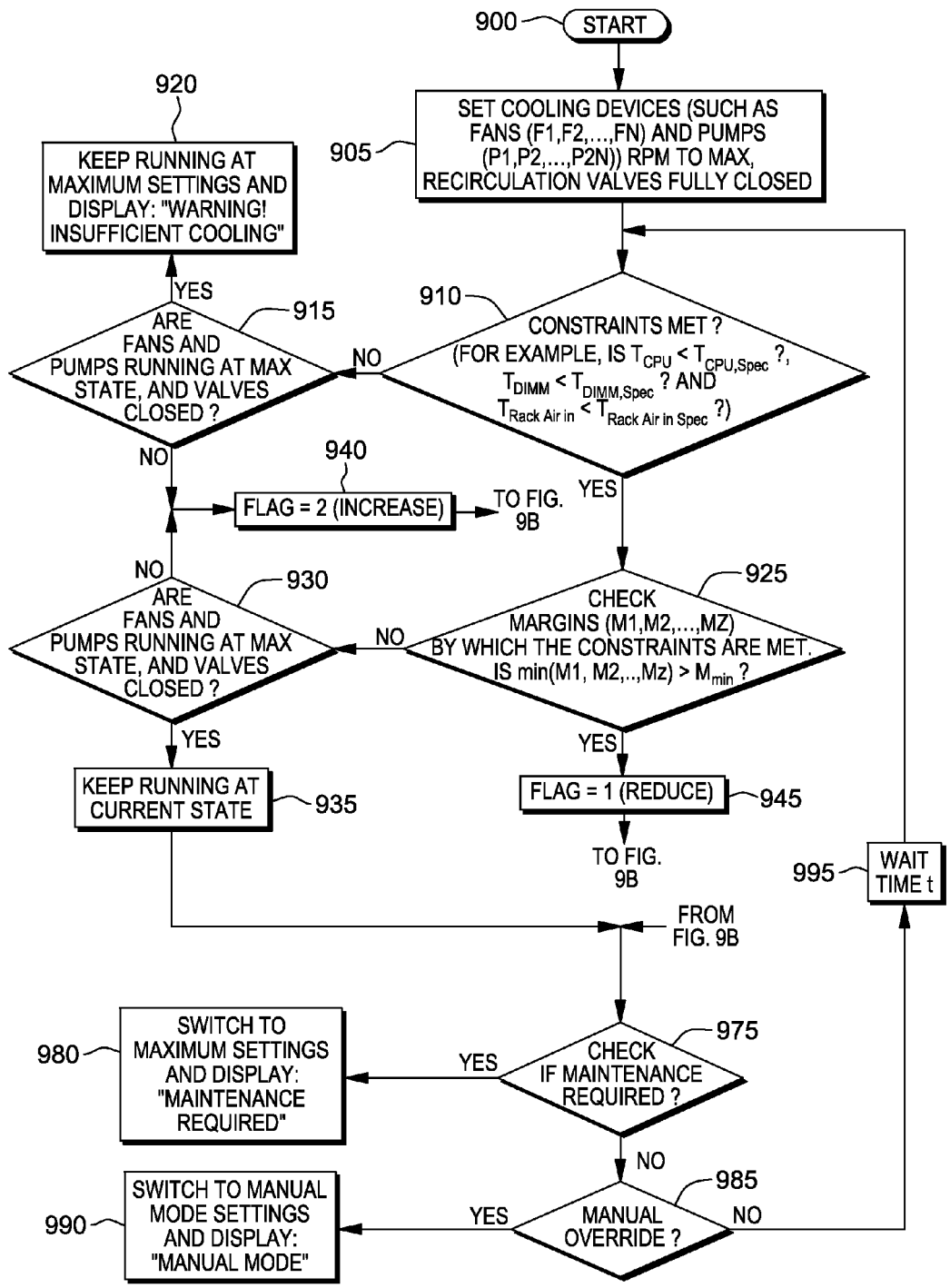
FIGS. 9A & 9B depict an alternate embodiment of a control process for a cooling apparatus, such as one of the cooling apparatuses depicted in FIGS. 7A-7D, in accordance with one or more aspects of the present invention.
Figure 9B:
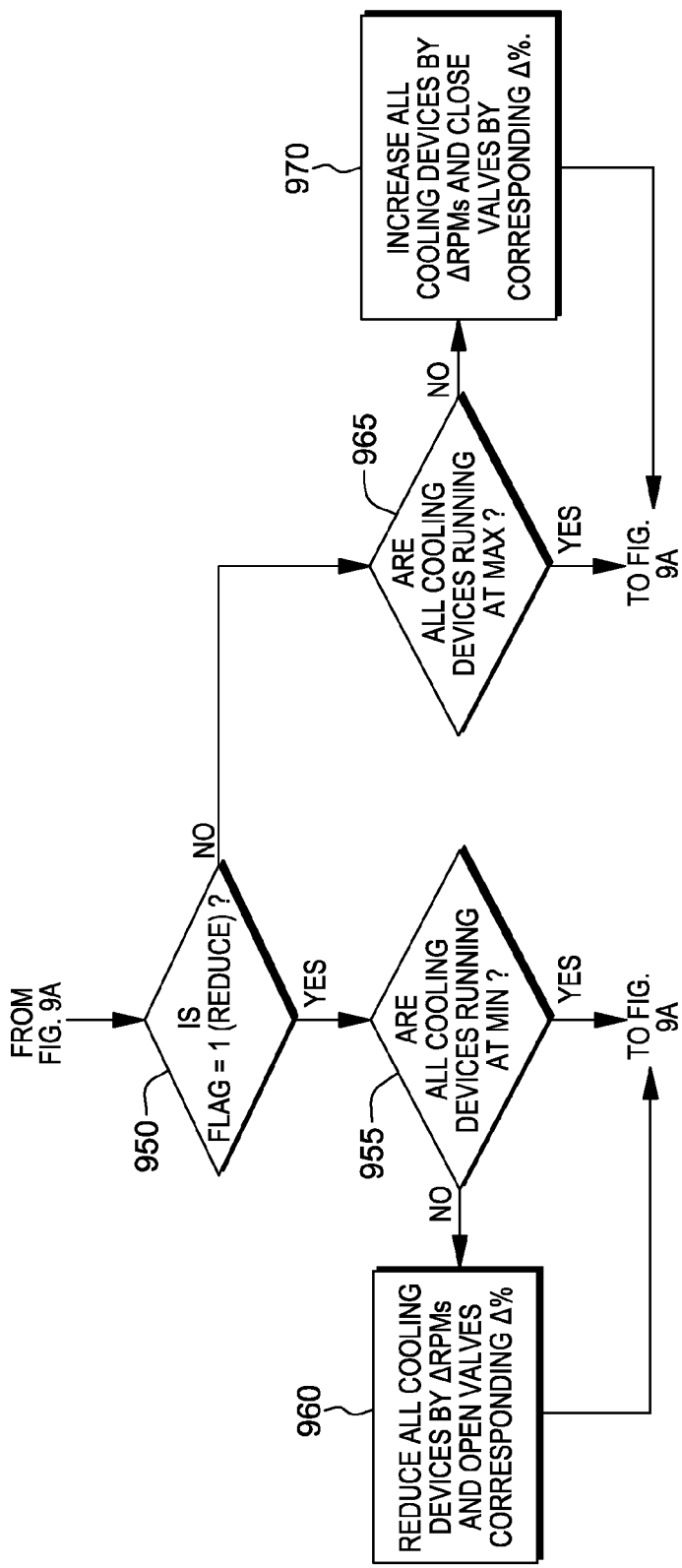

FIGS. 9A & 9B depict an alternate control process, wherein the controllable components are initiated at maximum operational control settings, and control setting changes are made to all controllable components in a related manner. Specifically, control processing is initiated 900 by setting the controllable components to maximum operational control settings, and any recirculation valves fully closed 905. By design, at this point, the constraint(s) should be satisfied 910, and if "no", processing determines whether the fans and coolant pumps are running at their maximum operational state and any recirculation valves are fully closed 915. If "yes", then an insufficient cooling warning is issued, and the controllable components continue to operate at their maximum operational control settings 920. If the fans and coolant pumps are not running at their maximum operational control settings 915, then processing sets a "flag" variable equal to 2 940, which indicates that operational control settings are to be increased, as explained further below. If the specified constraints are met 910, then processing checks the margins by which each input parameter meets its associated constraint, and determines whether the minimum margin of the ascertained margins is greater than a minimum specified margin 925. Note, in this regard, that margins (M1, M2 . . . ) can be normalized to vary from 1 to 100, and that Z is (in one example) also the number of constraints. If all of the ascertained margins are greater than the minimum specified margin, then the variable "flag" is assigned a value 1 945, which is a reduce cooling power consumption mode, as explained below. If all the margins are not greater than the minimum specified margin, then processing checks to determine whether the fans and coolant pumps are running at their respective maximum operational control settings, and if all the recirculation, bypass valves are fully closed. If all the controllable components are running at their maximum state, then the system will continue to run at that state 935. Otherwise, processing sets the "flag" variable to a value 2.

As illustrated in FIG. 9B, processing next determines whether the "flag" variable equals 1 950, and if "yes", determines whether the controllable components (or cooling devices) are all running at their minimum operational control settings 955. If "no", then processing reduces all controllable components by a corresponding ΔRPM, or opens the recirculation valves by a corresponding Δ% 960, before returning to the process of FIG. 9A to determine whether maintenance is required 975.

Continuing with FIG. 9B, if the "flag" variable is other than 1, processing determines whether the controllable components (or cooling devices) are running at their maximum operational control settings 965, and if "no", increases RPMs of all controllable components by ΔRPMs, or closes all recirculation valve(s) by Δ% 970, after which processing returns to the control process of FIG. 9A to determine whether maintenance is required 975. In one embodiment, the entire ΔRPM and Δ% increases or decreases are related. For example, these relations might comprise:

$$\Delta RPM\_F2 = X2*\Delta RPM\_F1, \Delta RPM\_F3 = x3*\Delta RPM\_F1, \ldots, \Delta RPM\_FN = XN*\Delta RPM\_F1 \quad (1)$$

$$\Delta RPM\_P1 = Y1*\Delta RPM\_F1, \Delta RPM\_P2 = Y2*\Delta RMP\_F1, \ldots, \Delta RPM\_P2N = Y2N*\Delta RPM\_F1 \quad (2)$$

$$\Delta\% \text{ Open}\_V1 = W1*\Delta RPM\_F1, \Delta\% \text{ Open}\_V2 = W2*\Delta RPM\_F1, \ldots, \Delta\% \text{ Open}\_VN = WN*\Delta RPM\_F1 \quad (3)$$

where ΔRPM_F1 is the change in RPM for fan F1, ΔRPM_F2 is the change in RPM to fan F2, etc.

Continuing with FIG. 9A, processing checks whether maintenance is required 975, and if "yes", switches the controllable components to maximum operational control settings and displays a "maintenance required" indication 980. If maintenance is not required, then processing determines whether there has been a manual override 985, and if "yes", switches to manual mode settings, and displays a "manual mode" indication 990. Thereafter, processing waits a time interval t 995 before again checking whether the constraints have been met by the current input parameters 910.

Figure 10A:
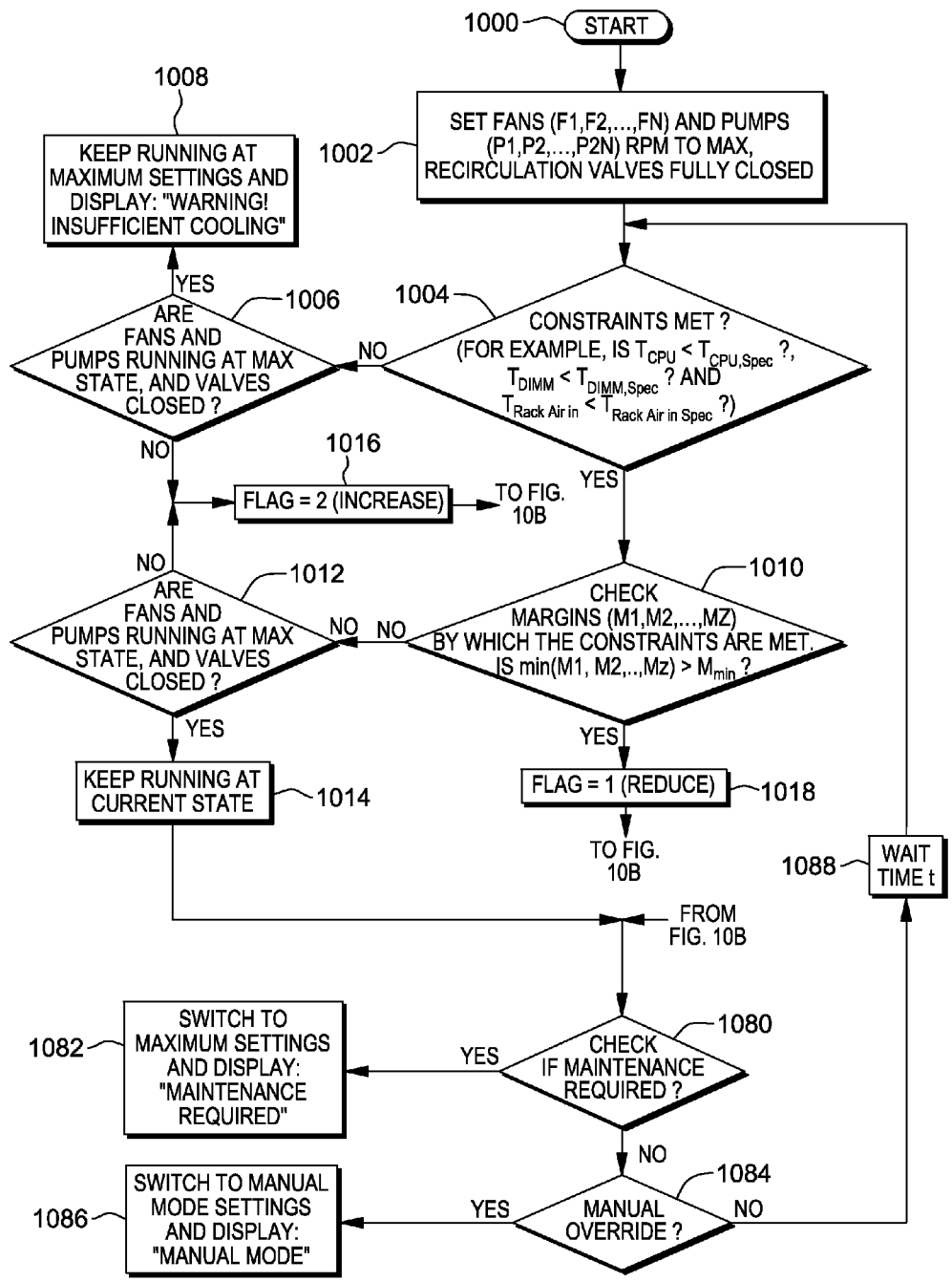
FIGS. 10A & 10B depict an another embodiment of a control process for a cooling apparatus, such as one of the cooling apparatuses depicted in FIGS. 7A-7D, in accordance with one or more aspects of the present invention.
Figure 10B:
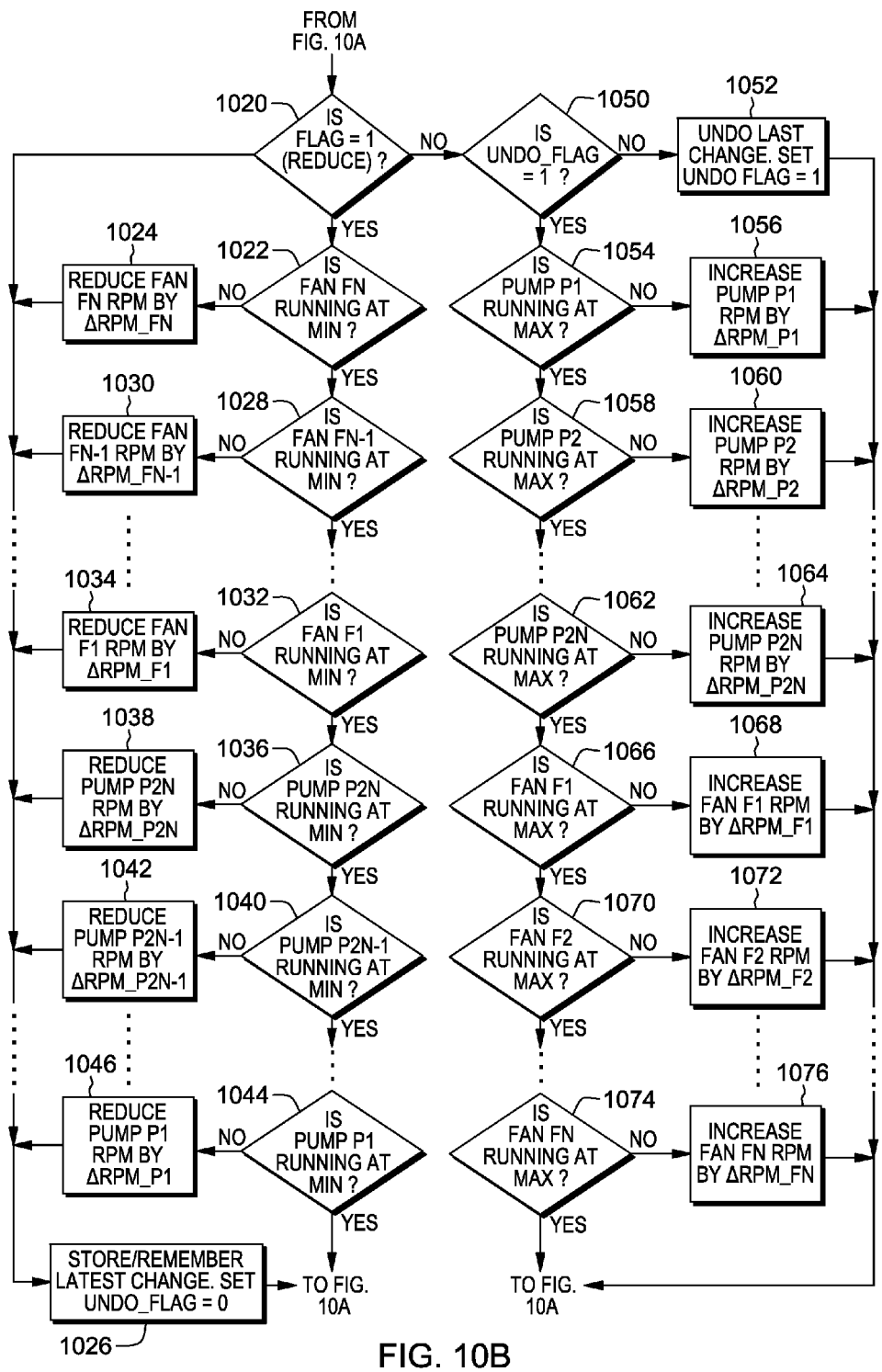

FIGS. 10A & 10B depict another control process, in accordance with one or more aspects of the present invention, wherein the controllable components are initiated at maximum operational control settings, and control setting changes are made one component at a time.

Specifically, control processing is initiated 1000 by setting the controllable components to maximum operational control settings, and any recirculation bypass valves fully closed 1002. By design, at this point, the constraint(s) should be satisfied 1004, and if "no", then processing determines whether the fans and coolant pumps are running at their maximum operational state and any recirculation valves are fully closed 1006. If "yes", then an insufficient cooling warning is issued, and the controllable components continue to operate at their maximum control settings 1008. If the fans and coolant pumps are not running at their maximum operational control settings 1006, then processing sets a "flag" variable equal to 2 1016, which indicates that operational control settings are to be serially, incrementally increased, as explained further below. If the specified constraints are met 1004, then processing checks the margins by which each input parameter meets its associated constraint, and determines whether the minimum margin of the ascertained margins is greater than a minimum specified margin 1010. If all of the ascertained margins are greater than the minimum specified margin, then the "flag" variable is assigned a value 1 1018, indicative of a reduce cooling power consumption mode, as explained below. If all the margins are not greater than the minimum specified margin, then processing checks to determine whether the fans and coolant pumps are running at their respective maximum operational control settings, and all of the recirculation valves are fully closed 1012. If all the controllable components are running at their maximum state, then processing will continue to run at that state 1014. Otherwise, processing sets the "flag" variable to a value 2 1016.

As illustrated in FIG. 10B, processing next determines whether the "flag" variable equals 1 1020 (that is, is the flag set to indicate a reduce cooling power consumption mode). If "yes", then the states of the controllable components, e.g., fans and coolant pumps, are sequentially checked, for example, in descending order, starting with fan FN, followed by fan FN−1, and so on, until reaching pump P1. Specifically, in the embodiment illustrated, the state of the $N^{th}$ fan (that is, fan FN) is initially checked 1022. If fan FN is not running at its minimum operational control setting, then fan FN is reduced by $\Delta RPM\_FN$ 1024, and control processing stores/remembers the latest state change by setting an "undo_flag" equal to zero 1026, before returning to the processing of FIG. 10A. If fan FN is running at its minimum operational control state, then processing checks whether fan FN−1 is running at its minimum operational control state 1028, and if "no", reduces fan FN−1 speed by $\Delta RPM\_FN-1$ 1030. Processing repeats the inquiries until reaching fan FN1 to determine whether it is running at its minimum operational control state 1032, and if "no", reduces speed of fan FN1 by $\Delta RPM\_F1$ 1034. Once all fan speeds have been reduced, further power consumption savings is obtained by evaluating the coolant pumps and serially, incrementally reducing coolant pump operation, if possible. Specifically, pump P2N is evaluated to determine whether it is running at minimum operational control setting 1036, and if "no", speed of pump P2N is reduced by $\Delta RPM\_P2N$ 1038. Once pump P2N is running at its minimum operational control setting, then processing evaluates pump P2N−1 to determine whether it is running at its minimum operational control state 1040, and if "no", reduces speed of pump P2N−1 by $\Delta RPM\_P2N-1$ 1042. The process continues until pump P1 is reached and a determination is made whether pump P1 is running at its minimum operational control state 1044, and if "no", processing reduces speed of pump P1 RPMs by $\Delta RPM\_P1$ 1046. If all controllable components are running at minimum operational control settings, then processing returns to the flow of FIG. 10A, where indicated.

If the value of "flag" variable is other than 1, that is, it is 2, indicative of an increase cooling mode, processing initially checks the value of the "undo_flag" variable 1050 to see whether it equals 1. If "no", then processing undoes the last operational control setting change 1052, and returns to the processing of FIG. 10A. Assuming that the "undo_flag" variable is 1, then the states of the cooling devices, that is, the fans and pumps, are checked in ascending order, starting from pump P1, followed by pump P2, and so on, until fan FN. Note that in this embodiment, the ordering of the fans and pumps may be any desired order, but that the increasing of operational control settings would be in an opposite order from the decreasing of operational control settings described above.

By way of example, power consumption may be initially minimized by evaluating the highest-power-consuming components lost. In the example presented, the state of pump P1 is initially checked to determine whether pump P1 is running at its maximum operational control setting 1054, and if "no", then the speed of pump P1 is increased by $\Delta RPM\_P1$ 1056. Once pump P1 is running at its maximum operational control setting, pump P2 is evaluated to determine whether it is running at maximum operational control setting 1058, and if "no", the speed pump P2 is increased by $\Delta RPM\_P2$ 1060. This process is repeated until reaching pump P2N, and determining whether it is running at maximum operational control setting 1062, and if "no", then speed of pump P2N is increased by $\Delta RPM\_P2N$ 1064.

After all coolant pumps are running at maximum operational control setting, then the fans are evaluated (in this example). Specifically, processing determines whether fan F1 is running at maximum operational control setting 1066, and if "no", increases speed of fan F1 by $\Delta RPM\_F1$ 1068. Once fan F1 is running at maximum operational control setting, and assuming further cooling is required, processing determines whether fan F2 is running at maximum operational control setting 1070, and if "no", increases speed of fan F2 by $\Delta RPM\_F2$ 1072. This process is repeated until processing reaches fan FN, and determines whether fan FN is running at maximum operational control setting 1074, and if "no", increases speed of fan FN by $\Delta RPM\_FN$ 1076, after which, processing returns to FIG. 10A where indicated.

Continuing with FIG. 10A, processing checks whether maintenance is required 1080, and if "yes", switches the controllable components to maximum operational control settings and displays a "maintenance required" indication 1082. If maintenance is not required, then processing determines whether there has been a manual override 1084, and if "yes", switches to manual mode settings, and displays a "manual mode" indication 1086. Otherwise, processing waits a time interval t 1088 before again checking whether the constraints have been met by the current input parameters 1004.

FIGS. 11A-11D depict another control process, in accordance with one or more aspects of the present invention, wherein the controllable components are initiated at maximum operational control settings, and control setting changes are made one at a time. This embodiment is similar to that described above in connection with FIGS. 10A-10B, except provision is made for also dynamically adjusting any recirculation valves within the cooling apparatus.

Figure 11A:
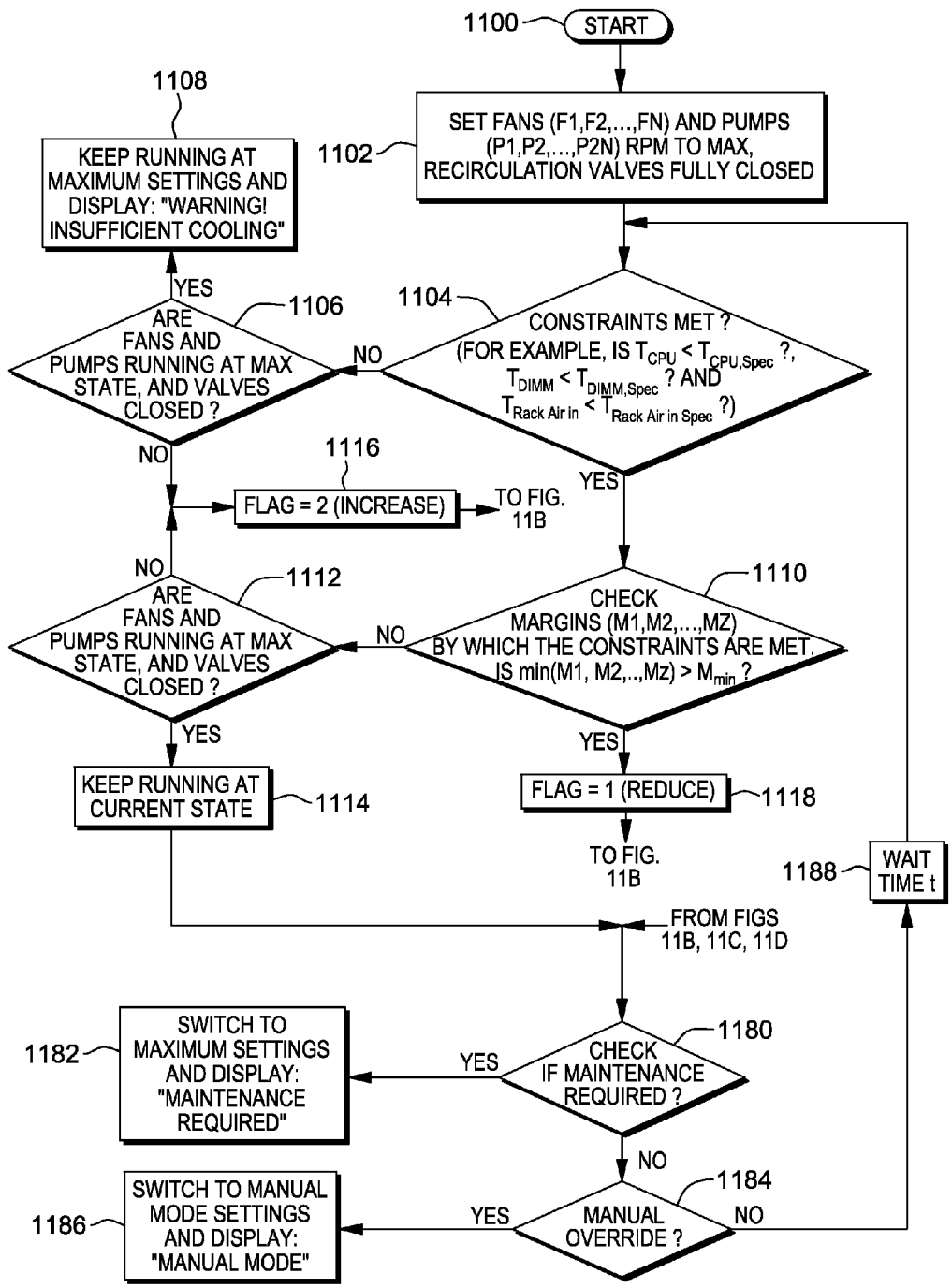
FIGS. 11A-11D depict a further embodiment of a control process for a cooling apparatus, such as one of the cooling apparatuses depicted in FIGS. 7A-7D, in accordance with one or more aspects of the present invention.

Beginning with FIG. 11A, control processing is initiated 1100 by setting the controllable components to maximum operational control settings, and the recirculation bypass valves fully closed 1102. By design, at this point, the constraint(s) should be satisfied 1104, and if "no", then processing determines whether the fans and coolant pumps are running at their maximum operational state and any recirculation valves are fully closed 1106. If "yes", then an insufficient cooling warning is issued, and the controllable components continue to operate at their maximum control settings 1108. If the fans and coolant pumps are not running at their maximum operational control settings 1106, then processing sets a "flag" variable equal to 2 1116, which indicates that operational control settings are to be serially, incrementally increased, as explained further below. If the specified constraints are met 1104, then processing checks the margins by which each input parameter meets its associated constraint, and determines whether the minimum margin of the ascertained margins is greater than a minimum specified margin 1110. If all of the ascertained margins are greater than the minimum specified margin, then the "flag" variable is assigned a value 1 1118, indicative of a reduce cooling power consumption mode, as explained below. If all the margins are not greater than the minimum specified margin, then processing checks to determine whether the fans and coolant pumps are running at their respective maximum operational control settings, and all of the recirculation valves are fully closed 1112. If all the controllable components are running at their maximum state, then processing will continue to run at that state 1114. Otherwise, processing sets the "flag" variable to a value 2 1116.

Figure 11B:
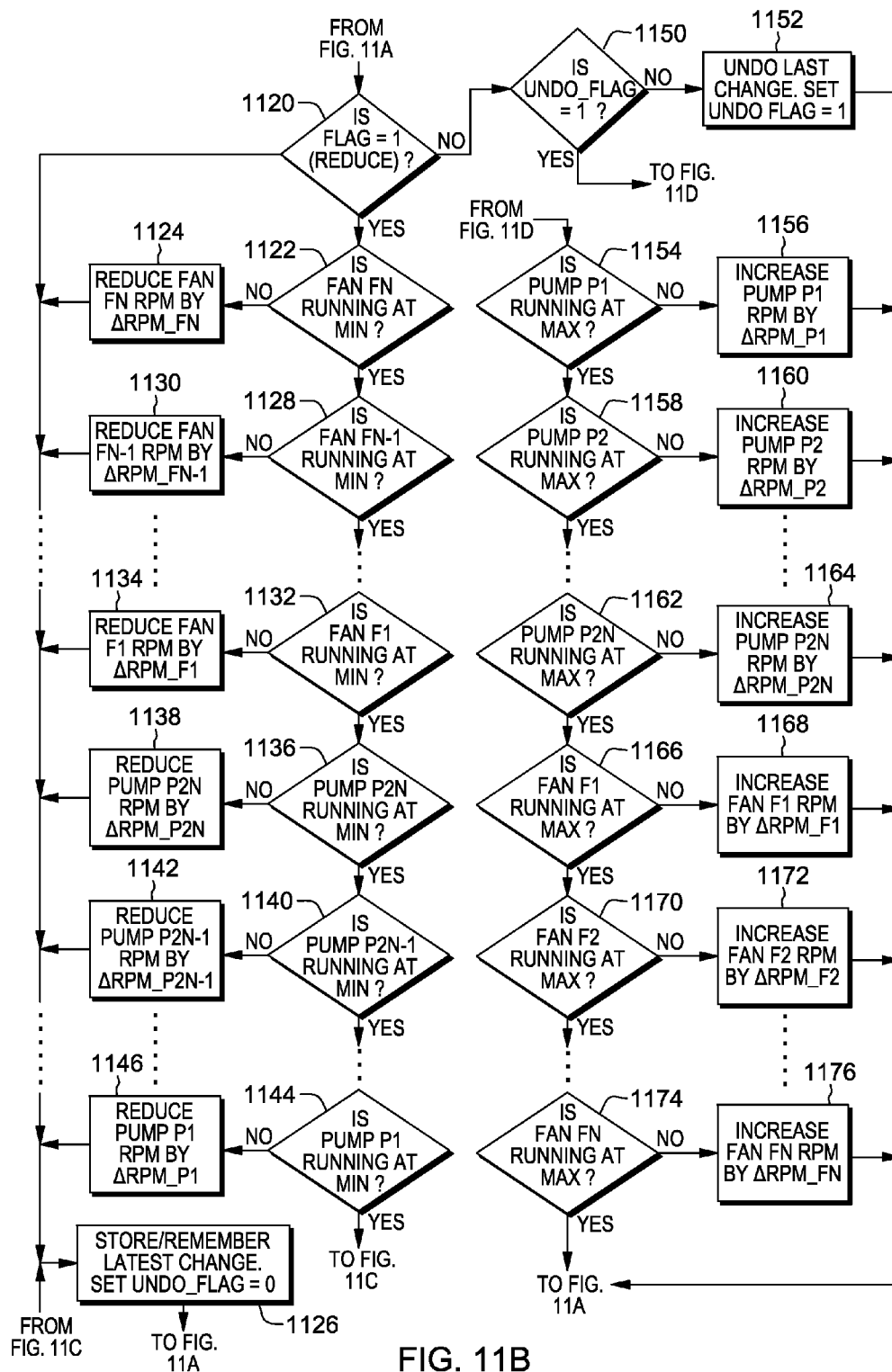

As illustrated in FIG. 11B, processing next determines whether the "flag" variable equals 1 1120 (that is, is the flag set to indicate a reduce cooling power consumption mode). If "yes", then the states of the controllable components, e.g., fans and coolant pumps, are sequentially checked, for example, in descending order, starting with fan FN, followed by fan FN−1, and so on, until reaching pump P1. Specifically, in the embodiment illustrated, the state of the $N^{th}$ fan (that is, fan FN) is initially checked 1122. If fan FN is not running at its minimum operational control setting, then fan FN is reduced by ΔRPM_FN 1124, and control processing stores/remembers the latest state change by setting an "undo_flag" equal to zero 1126, before returning to the processing of FIG. 11A. If fan FN is running at its minimum operational control state, then processing checks whether fan FN−1 is running at its minimum operational control state 1128, and if "no", reduces fan FN−1 speed by ΔRPM_FN−1 1130. Processing repeats the inquiries until reaching fan FN1 to determine whether it is running at its minimum operational control state 1132, and if "no", reduces fan FN1 speed by ΔRPM_F1 1134. Once all fan speeds have been reduced, further power consumption savings may be obtained by evaluating the coolant pumps and serially, incrementally reducing coolant pump operation, if possible. Specifically, pump P2N is evaluated to determine whether it is running at minimum operational control setting 1136, and if "no", speed of pump P2N is reduced by ΔRPM_P2N 1138. Once pump P2N is running at its minimum operational control setting, then processing evaluates pump P2N−1 to determine whether it is running at its minimum operational control state 1140, and if "no", reduces speed of pump P2N−1 by ΔRPM_P2N−1 1142. The process continues until pump P1 is reached and a determination is made whether pump P1 is running at its minimum operational control state 1144, and if "no", processing reduces speed of pump P1 by ΔRPM_P1 1146.

Figure 11D:
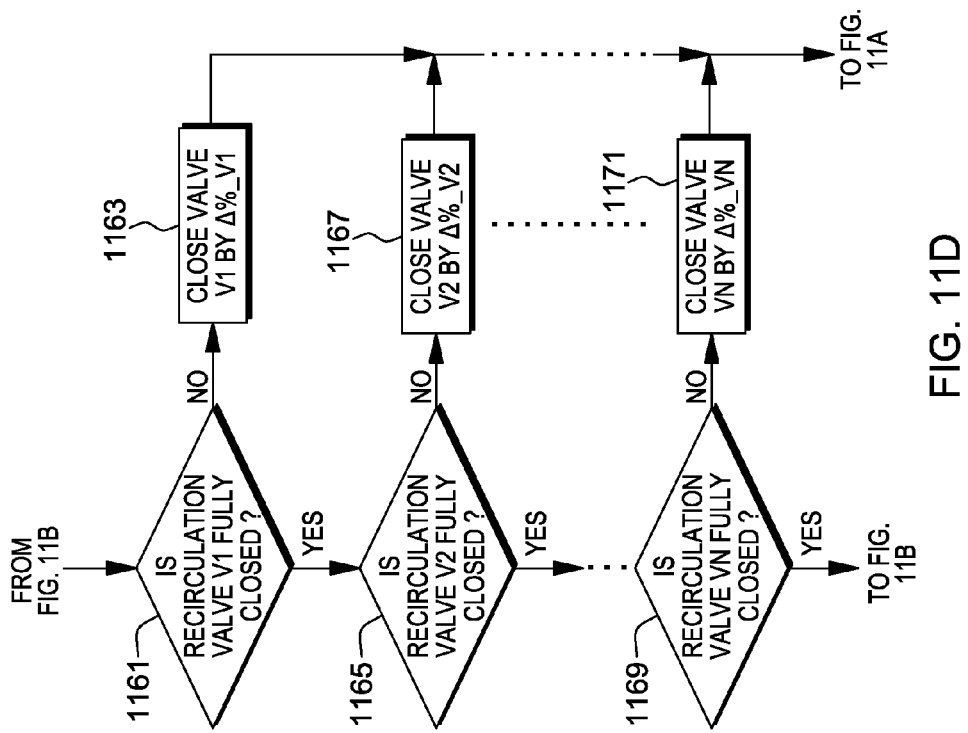
Figure 11C:
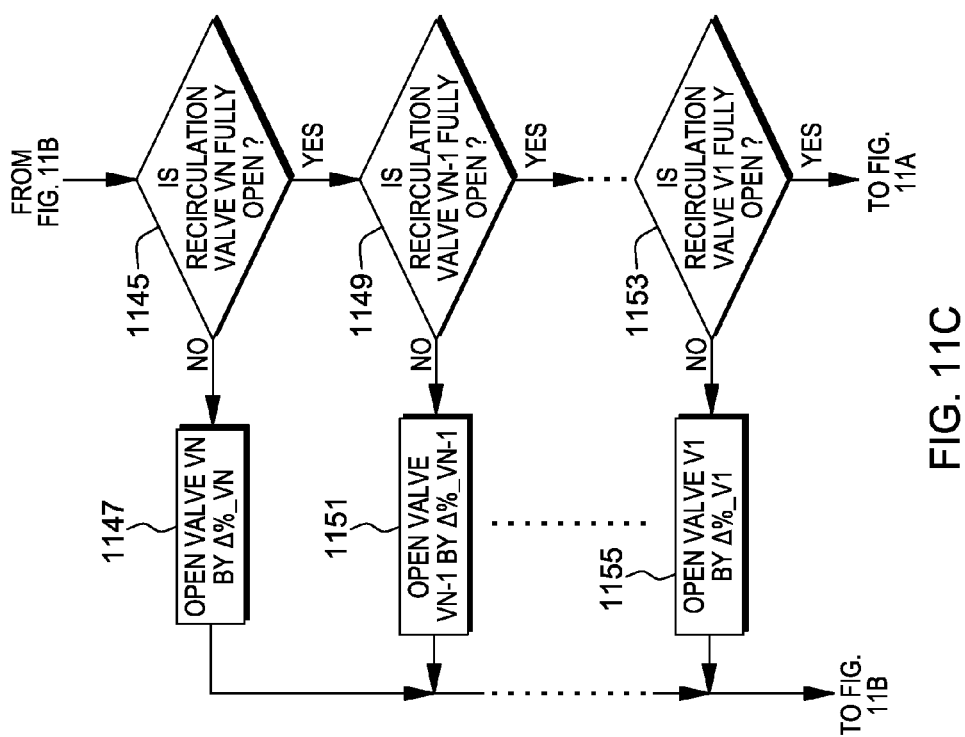

Once all pumps are running at minimum operational control settings, then processing passes to the flow of FIG. 11C, and determines whether recirculation valve VN is fully open 1145, and if "no", further opens the valve VN by Δ%_VN 1147, before returning to FIG. 11B, to store/remember the latest change my setting the "undo_flag" equal to zero, and then returning to the process of FIG. 11A, wherein indicated. Once recirculation valve VN is fully open, then processing determines whether recirculation valve VN−1 is fully open 1149, and if "no", incrementally opens valve VN−1 by Δ%_VN-1 1151. This one at a time, incremental adjusting of the valves repeats until processing reaches valve V1, and determines whether recirculation valve V1 is fully open 1153, and if "no", opens valve V1 by Δ%_V1 1155. Otherwise, if all controllable components have been adjusted to conserve cooling energy, processing returns to the flow of FIG. 11A, where indicated.

Continuing with FIG. 11B, if the value of "flag" variable is other than 1, that is, it is 2, indicative of an increase cooling mode, processing initially checks the value of the "undo_flag" variable 1150 to see whether it equals 1. If "no", then processing undoes the last operational control setting change 1152, and returns to the processing of FIG. 11A, where indicated. Assuming that the "undo_flag" variable is 1, then the states of all cooling devices, that is, the fans, pumps, and recirculation valves are checked in ascending order, starting from recirculation valve V1 (FIG. 11D), followed by recirculation valve V2, and so on, until reaching fan FN. Note that in this embodiment, the ordering of the fans, pumps and valves may be any desired ordering, but that the increasing of operational control settings is in an opposite order from the decreasing of operational control settings described above.

As noted, FIG. 11D evaluates and adjusts the recirculation valves to determine the incremental closures to be made in the increase cooling mode. Processing initially determines whether recirculation valve V1 is fully closed 1161, and if "no", incrementally closes recirculation valve V1 by Δ%_V1 1163, before returning to the processing of FIG. 11A, where indicated. Once valve V1 is fully closed, processing determines whether recirculation valve V2 is fully closed 1165, and if "no", incrementally closes valve V2 by Δ%_V2 1167. The incremental valve closures continue until valve VN is reached, and processing determines whether recirculation valve VN is fully closed 1169, and if "no", incrementally closes valve VN by Δ%_VN 1171. Once all recirculation valves are fully closed, processing continues with the control process of FIG. 11B, where indicated.

As illustrated in FIG. 11B, additional cooling is provided, in this example, by checking the state of pump P1 to determine whether pump P1 is running at maximum operational control setting 1154, and if "no", then the speed of pump P1 is increased by ΔRPM_P1 1156. Once pump P1 is running at maximum operational control setting, pump P2 is evaluated to determine whether it is running at maximum operational control setting 1158, and if "no", then the speed of pump P2 is increased by ΔRPM_P2 1160. This process is repeated until reaching pump P2N, and determining whether it is running at maximum operational control setting 1162, and if "no", then the speed of pump P2N is increased by ΔRPM_P2N 1164.

After all coolant pumps are running at maximum operational control setting, then the fans are evaluated (in this example). Specifically, processing determines whether fan F1 is running at maximum operational control setting 1166, and if "no", increases the speed of fan F1 by ΔRPM_F1 1168. Once fan F1 is running at maximum operational control setting, processing determines whether fan F2 is running at maximum operational control setting 1170, and if "no", increases the speed of fan F2 by ΔRPM_F2 1172. This process is repeated until processing reaches fan FN, and determines whether fan FN is running at maximum operational control setting 1174, and if "no", increases the speed of fan FN by ΔRPM_FN 1176, after which, processing returns to FIG. 11A, where indicated.

Continuing with FIG. 11A, processing checks whether maintenance is required 1180, and if "yes", switches the controllable components to maximum operational control settings and displays a "maintenance required" indication 1182. If maintenance is not required, then processing determines whether there has been a manual override 1184, and if "yes", switches to manual mode settings, and displays a "manual mode" indication 1186. Otherwise, processing waits a time interval t 1188 before again checking whether the constraints have been met by the current input parameters 1104.

Note again that the incremental, stepwise processing of FIGS. 11A-11D proceeds in a number-based manner. The controllable components, i.e., recirculation valves, pumps and fans (in this example), may be numbered in any desired manner. For example, the components may be numbered based on physical location within the cooling system, or based on power that the components consume at their maximum state, with the highest number given to the unit that consumes the maximum power, and the lowest number given to the unit that consumes the minimum power.

As will be appreciated by one skilled in the art, control aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, control aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable signal medium may be any non-transitory computer readable medium that is not a computer readable storage medium and that can communicate, propagate, or transport a program for use by or in connection with an instruction execution system, apparatus or device.

A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 12:
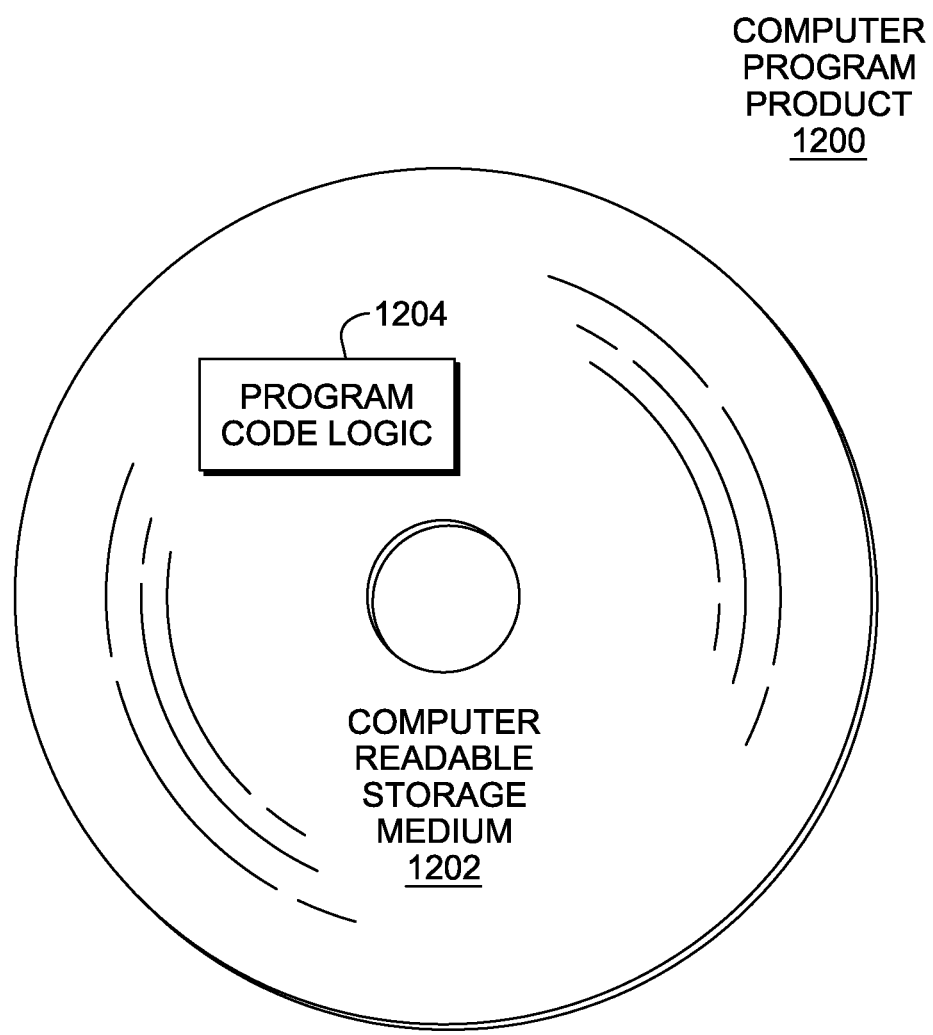
FIG. 12 depicts one embodiment of a computer program product or a computer-readable storage medium incorporating one or more aspects of the present invention.

Referring now to FIG. 12, in one example, a computer program product 1200 includes, for instance, one or more computer readable storage media 1202 to store computer readable program code means or logic 1204 thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples.

Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. For example, computing environments of other architectures can incorporate and use one or more aspects of the present invention. Additionally, the network of nodes can include additional nodes, and the nodes can be the same or different from those described herein. Also, many types of communications interfaces may be used.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

For completeness, Table 1 below lists and describes the variables referenced herein in describing certain embodiments of the present invention.

TABLE 1

| Variable | Definition |
|---|---|
| DP | Dew Point |
| H | Humidity |
| P | Pressure |
| T | Temperature |
| F1 | $1^{st}$ Fan or Fan F1 |
| F2 | $2^{nd}$ fan or Fan F2 |
| FN-1 | (N-1)th Fan (or Fan FN-1) |
| FN | Nth Fan (or Fan FN) |
| P1 | $1^{st}$ Pump or Pump P1 |
| P2 | $2^{nd}$ Pump or Pump P2 |
| P2N-1 | (2N-1)th Pump (or Pump P2N-1) |
| P2N | 2Nth Pump (or Pump P2N) |
| V1 | Recirculation valve V1 |
| V2 | Recirculation valve V2 |
| VN-1 | Recirculation valve VN-1 ((N-1)th Valve) |
| VN | Recirculation valve VN (Nth Valve) |
| ΔRPM_F1 | Change in RPM for Fan F1 |
| ΔRPM_F2 | Change in RPM for Fan F2 |
| ΔRPM_FN-1 | Change in RPM for $(N-1)^{th}$ Fan (or Fan FN-1) |
| ΔRPM_FN | Change in RPM for Nth Fan (or Fan FN) |
| ΔRPM_P1 | Change in RPM for Pump P1 |
| ΔRPM_P2 | Change in RPM for Pump P2 |
| ΔRPM_P2N-1 | Change in RPM for $(2N-1)^{th}$ Pump (or Pump P2N-1) |
| ΔRPM_P2N | Change in RPM for $2N^{th}$ Pump (or Pump P2N) |
| Δ% Open_V1 | Change in % Open for the Recirculation valve V1 |
| Δ% Open_V2 | Change in % Open for the Recirculation valve V2 |
| Δ% Open_VN-1 | Change in % Open for the Recirculation valve VN-1 ((N-1)th Valve) |
| Δ% Open_VN | Change in % Open for the Recirculation valve VN ($N^{th}$ Valve) |
| Δ%_V1 | Change in % Open for the Recirculation valve V1 |
| Δ%_V2 | Change in % Open for the Recirculation valve V2 |
| Δ%_VN-1 | Change in % Open for the Recirculation valve VN-1 ($(N-1)^{th}$ Valve) |
| Δ%_VN | Change in % Open for the Recirculation valve VN ($N^{th}$ Valve) |
| IZ | $Z^{th}$ Input condition |
| Z | Total number of input conditions or inputs |
| I1, 1 | Value of input condition 1 at row 1 |
| I1, 2 | Value of input condition 1 at row 2 |
| I1, r1 | Value of input condition 1 at row r1 |
| I1, r2 | Value of input condition 1 at row r2 |
| I1, r | Value of input condition 1 at row r |
| I2, 1 | Value of input condition 2 at row 1 |
| I2, 2 | Value of input condition 2 at row 2 |
| I2, r3 | Value of input condition 2 at row r3 |
| I2, r4 | Value of input condition 2 at row r4 |
| I2, r | Value of input condition 2 at row r |
| IZ, 1 | Value of input condition Z at row 1 |
| IZ, 2 | Value of input condition Z at row 2 |

TABLE 1-continued

| Variable | Definition |
|---|---|
| IZ, r | Value of input condition Z at row r |
| F1, 1 | Value of Fan F1 RPM at row 1 |
| F1, 2 | Value of Fan F1 RPM at row 2 |
| F1, r | Value of Fan F1 RPM at row r |
| F2, 1 | Value of Fan F2 RPM at row 1 |
| F2, 2 | Value of Fan F2 RPM at row 2 |
| F2, r | Value of Fan F2 RPM at row r |
| FN, 1 | Value of Fan FN RPM at row 1 |
| FN, 2 | Value of Fan FN RPM at row 2 |
| FN, r | Value of Fan FN RPM at row r |
| Flag | Flag = 1 means reduce RPMs and/or open recirculation valve(s) and Flag = 2 means increase RPMs and/or close recirculation valve(s) |
| P1, 1 | Value of Pump P1 RPM at row 1 |
| P1, 2 | Value of Pump P1 RPM at row 2 |
| P1, r | Value of Pump P1 RPM at row r |
| P2, 1 | Value of Pump P2 RPM at row 1 |
| P2, 2 | Value of Pump P2 RPM at row 2 |
| P2, r | Value of Pump P2 RPM at row r |
| P2N, 1 | Value of Pump P2N RPM at row 1 |
| P2N, 2 | Value of Pump P2N RPM at row 2 |
| P2N, r | Value of Pump P2N RPM at row r |
| V1, 1 | Value of Recirculation Valve V1% Open at row 1 |
| V1, 2 | Value of Recirculation Valve V1% Open at row 2 |
| V1, r | Value of Recirculation Valve V1% Open at row r |
| V2, 1 | Value of Recirculation Valve V2% Open at row 1 |
| V2, 2 | Value of Recirculation Valve V2% Open at row 2 |
| V2, r | Value of Recirculation Valve V2% Open at row r |
| VN, 1 | Value of Recirculation Valve VN % Open at row 1 |
| VN, 2 | Value of Recirculation Valve VN % Open at row 2 |
| VN, r | Value of Recirculation Valve VN % Open at row r |
| M1 | Margin by which the first constraint is met |
| M2 | Margin by which the second constraint is met |
| Mz | Margin by which the $Z^{th}$ constraint is met |
| Z | Total number of constraints |
| $T_{CPU}$ | Hottest CPU or Maximum CPU Temperature |
| $T_{CPU, spec}$ | Maximum allowed CPU Temperature |
| $T_{DIMM}$ | Hottest DIMM or Maximum DIMM Temperature |
| $T_{DIMM, Spec}$ | Maximum allowed DIMM Temperature |
| $T_{rack\_air\_in}$ | Rack Inlet Air Temperature |
| $T_{rack\_air\_in, spec}$ | Maximum allowed Rack Inlet Air Temperature |
| $T_{rack\,DP}$ | Rack Dew Point Temperature |
| $T_{rack\_DP, spec}$ | Allowed Rack Dew Point Temperature |
| Undo_Flag | Undo_Flag = 0 means a change was made to reduce the cooling power. Undo_Flag = 1 means last change was reverted. |
| X2 | Relationship variable between ΔRPM_F2 and ΔRPM_F1 |
| X3 | Relationship variable between ΔRPM_F3 and ΔRPM_F1 |
| XN | Relationship variable between ΔRPM_FN and ΔRPM_F1 |
| Y1 | Relationship variable between ΔRPM_P1 and ΔRPM_F1 |
| Y2 | Relationship variable between ΔRPM_P2 and ΔRPM_F1 |
| Y2N | Relationship variable between ΔRPM_P2N and ΔRPM_F1 |
| W1 | Relationship variable between Δ% Open_V1 and ΔRPM_F1 |
| W2 | Relationship variable between Δ% Open_V2 and ΔRPM_F1 |
| WN | Relationship variable between Δ% Open_VN and ΔRPM_F1 |

What is claimed is:

1. A cooling apparatus comprising:
   at least one coolant-cooled structure associated with an electronics rack for facilitating dissipation of heat from the electronics rack, the at least one coolant-cooled structure comprising at least one coolant-carrying passage;
   a coolant loop coupled in fluid communication with the at least one coolant-carrying passage of the at least one coolant-cooled structure;
   at least one heat exchange unit coupled to facilitate heat transfer from liquid coolant within the coolant loop;
   N controllable components associated with at least one of the coolant loop or the at least one heat exchange unit, the N controllable components having operation setting ranges which facilitate control of at least one of circulating of the liquid coolant through the coolant loop or transfer of heat from the coolant via the at least one heat exchange unit, wherein N≥2; and
   a controller coupled to the N controllable components, the controller being programmed to dynamically control operational settings of the N controllable components, based on Z input parameters and one or more specified constraints, to provide a specified cooling to the at least one coolant-cooled structure, and to minimize energy consumed by the N controllable components in providing the specified cooling to the at least one coolant-cooled structure with reference to predetermined operational characterizations of the N controllable components within the cooling apparatus, wherein Z≥1.

2. The cooling apparatus of claim 1, wherein the controller programmed to dynamically control operational settings of the N controllable components comprises the controller programmed to identify a set of operational control settings, to be applied to the N controllable components, from a prespecified data structure of the predetermined operational characterizations employing the Z input parameters, the prespecified data structure comprising a plurality of sets of operational control settings for the N controllable components.

3. The cooling apparatus of claim 2, wherein the controller identifying the set of operational control settings comprises the controller dynamically selecting the set of operational control settings based on an input parameter of the Z input parameters currently determined to comprise a most critical value in comparison to a respective specified constraint of the one or more specified constraints.

4. The cooling apparatus of claim 2, wherein the controller dynamically adjusting operation of the N controllable components comprises the controller applying the identified set of operational control settings to the N controllable components, the identified set of operational control settings comprising a respective control setting for each controllable component of the N controllable components.

5. The cooling apparatus of claim 1, wherein the controller initially operates the N controllable components at respective maximum operational control settings, and responsive to the one or more specified constraints being met, dynamically adjusts operation of the N controllable components, based on the Z input parameters, wherein the Z input parameters comprise measured input parameters.

6. The cooling apparatus of claim 1, wherein the controller dynamically controlling operational settings of the N controllable components comprises the controller ascertaining a margin by which each input parameter of the Z input parameters meets a respective specified constraint of the one or more specified constraints, and the controller determining whether a minimum margin of the ascertained margins exceeds a specified minimum margin, and responsive to the minimum margin exceeding the specified minimum margin, the controller dynamically reducing one or more operational control settings for the N controllable components.

7. The cooling apparatus of claim 6, wherein, responsive to the minimum margin exceeding the specified minimum margin, the controller dynamically reduces a respective operational control setting for each controllable component of the N controllable components, wherein the respective operational control setting decreases are related.

8. The cooling apparatus of claim 6, wherein, responsive to the minimum margin of the ascertained margins being below the specified minimum margin, the controller dynamically increases one or more operational control settings for the N controllable components.

9. The cooling apparatus of claim 8, wherein, responsive to the minimum margin of the ascertained margins being below the specified minimum margin, the controller dynamically increases a respective operational control setting for each controllable component of the N controllable components, wherein the respective operational control setting increases are related.

10. The cooling apparatus of claim 6, wherein, responsive to the minimum margin of the ascertained margins exceeding, the specified minimum margin, the controller dynamically incrementally reduces an operational control setting for one controllable component of the N controllable components, and upon reaching a minimum operational control setting for the one controllable component, the controller dynamically incrementally reduces another operational control setting for another controllable component of the N controllable components.

11. The cooling apparatus of claim 6, wherein, responsive to the minimum margin of the ascertained margins being below the specified minimum margin, the controller dynamically incrementally increases an operational control setting for one controllable component of the N controllable components, and upon reaching a maximum operational control setting for the one controllable component, the controller dynamically incrementally increases another operational control setting for another controllable component of the N controllable components.

12. The cooling apparatus of claim 1, wherein the N controllable components comprise at least one of a coolant pump associated with the coolant loop, a fan associated with the at least one heat exchange unit, or a flow control valve associated with the coolant loop.

13. The cooling apparatus of claim 1, wherein the at least one heat exchange unit comprises an outdoor-air-cooled heat exchange unit, the outdoor-air-cooled heat exchange unit cooling coolant passing through the coolant loop by dissipating heat from the coolant to outdoor ambient air.

14. A cooled electronic system comprising:
an electronics rack; and
a cooling apparatus facilitating dissipation of heat from the electronics rack, the cooling apparatus comprising:
   at least one coolant-cooled structure associated with the electronics rack for facilitating dissipation of heat from the electronics rack, the at least one coolant-cooled structure comprising at least one coolant-carrying passage;
   a coolant loop coupled in fluid communication with the at least one coolant-carrying passage of the at least one coolant-cooled structure;
   at least one heat exchange unit coupled to facilitate heat transfer from liquid coolant within the coolant loop;
   N controllable components associated with at least one of the coolant loop or the at least one heat exchange unit, the N controllable components having operational setting ranges which facilitate control of at least one of circulating of the liquid coolant through the coolant loop or transfer of heat from the coolant via the at least one heat exchange unit, wherein $N \geq 2$; and
   a controller coupled to the N controllable components, the controller being programmed to dynamically control operational settings of the N controllable components, based on Z input parameters and one or more specified constraints, to provide a specified cooling to the at least one coolant-cooled structure, and to minimize energy consumed by the N controllable components, in providing the specified cooling to the at least one coolant-cooled structure with reference to predetermined operational characterizations of the N controllable components within the cooling apparatus, wherein $Z \geq 1$.

15. The cooled electronic system of claim 14, wherein the controller dynamically controlling operational settings of the N controllable components comprises the controller identifying a set of operational control settings, to be applied to the N controllable components, from a prespecified data structure employing the Z input parameters, the prespecified data structure comprising a plurality of sets of operational control settings for the N controllable components.

16. The cooled electronic system of claim 14, wherein the controller dynamically adjusting operation of the N controllable components comprises the controller ascertaining a margin by which each input parameter of the Z input parameters meets a respective specified constraint of the one or more specified constraints, and the controller determining whether a minimum margin of the ascertained margins exceeds a specified minimum margin, and responsive to the minimum margin exceeding the specified minimum margin, the controller dynamically reducing one or more operational control settings for the N controllable components, and wherein, responsive to the minimum margin of the ascertained margins being below the specified minimum margin, the controller dynamically increases one or more operational control settings for the N controllable components.

17. The cooled electronic system of claim 16, wherein, responsive to the minimum margin of the ascertained margins exceeding the specified minim margin, the controller dynamically incrementally reduces an operational control setting for one controllable component of the N controllable components, and upon reaching a minimum operational control setting for the one controllable component, the controller dynamically incrementally reduces another operational control setting for another controllable component of the N controllable components, and wherein, responsive to the minimum margin of the ascertained margins being below the specified minimum margin, the controller dynamically incrementally increases an operational control setting for one controllable component of the N controllable components, and upon reaching a maximum operational control setting for the one controllable component, the controller dynamically incrementally increases another operational control setting for another controllable component of the N controllable components.

18. The cooled electronic system of claim 14, wherein the at least one heat exchange unit comprises an outdoor-air-cooled heat exchange unit, the outdoor-air-cooled heat exchange unit cooling coolant passing through the coolant loop by dissipating heat from the coolant to outdoor ambient air.

* * * * *